US007242340B2

(12) United States Patent
Ono

(10) Patent No.: US 7,242,340 B2
(45) Date of Patent: Jul. 10, 2007

(54) INPUT DEVICE AND INPUT METHOD

(75) Inventor: Junichi Ono, Aichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 899 days.

(21) Appl. No.: 10/660,580

(22) Filed: Sep. 12, 2003

(65) Prior Publication Data

US 2004/0051623 A1 Mar. 18, 2004

(30) Foreign Application Priority Data

Sep. 13, 2002 (JP) ............................. 2002-268910
Nov. 15, 2002 (JP) ............................. 2002-331790

(51) Int. Cl.
*H03M 1/12* (2006.01)

(52) U.S. Cl. .......................... 341/155; 341/22; 341/26; 341/154

(58) Field of Classification Search ..................... None
See application file for complete search history.

(56) References Cited

U.S. PATENT DOCUMENTS 3,765,015 A * 10/1973 Gruner ....................... 341/173
4,884,070 A * 11/1989 Hannaford ............. 340/825.78
5,983,116 A * 11/1999 Nash et al. .............. 455/575.1
6,639,523 B2 * 10/2003 Kaikuranta et al. ........... 341/22
6,970,752 B1 * 11/2005 Lim et al. ..................... 700/94

FOREIGN PATENT DOCUMENTS

JP A 8-146053 6/1996
JP A 10-161812 6/1998

* cited by examiner

*Primary Examiner*—Khai M. Nguyen
(74) *Attorney, Agent, or Firm*—Oliff & Berridge, PLC

(57) ABSTRACT

First and second resistors are given a common length L and arranged to have a constant equal resistance per unit length. A plurality of switch elements are made conductive between the resistors. A predetermined constant voltage V1 is applied to one terminal of the resistor through a wiring. The voltage value AD1 at the other terminal of the resistor is detected by a processing unit through a wiring. The voltage value AD2 at one terminal of the resistor is detected by the processing unit through a wiring. The other terminal of the resistor is connected with the ground through a wiring. On the basis of the voltage values AD1 and AD2 detected, the operating states of the individual switch elements are detected by the processing unit.

36 Claims, 14 Drawing Sheets

T3

| U2 / Q4 | Q5 |
|---|---|
| α1<AD1<β1 | γ1<AD2<δ1 |
| α2<AD1<β2 | γ2<AD2<δ2 |
| α3<AD1<β3 | γ3<AD2<δ3 |
| ⋮ | ⋮ |

INPUT DEVICE AND INPUT METHOD

BACKGROUND OF THE INVENTION

1. Field of the Invention

The present invention relates to an input device and an input method for accepting an input on a basis of a conductive condition, which is established by an operation either directly between linear- or band-shaped first and second resistors arranged in parallel to oppose each other or indirectly through another conductive member.

2. Description of the Related Art

As a related art of the present invention, there is a voltage detecting switch, such disclosed in JP-A-8-146053, which has a circuit in combination of a plurality of resistors and switches for detecting different voltages (or partial voltages) with the individual switches thereby to discriminate the switches with the voltages.

In the related art described above, however, the voltages to be detected at the individual switch conduction times contain the influences of the contact resistances of the switches. Due to the dispersion of the contact resistances of the individual switches, therefore, the values of the partial voltages to be detected may also disperse to make it impossible to discriminate the switches accurately.

SUMMARY OF THE INVENTION

It is therefore an object of the invention is to provide an input device and an input method, which is enabled by a simple circuit configuration to detect conductive condition, as caused by an operation, between resistors accurately and to accept an input without being influenced by the contact resistances or the like between the resistors.

In order to achieve the object, according to a first aspect of the invention, there is provided an input device including: a first resistor and a second resister each having an equal size and shape extending in one direction and arranged in parallel to each other and each having a constant and equal resistance per unit length in longitudinal direction thereof; and a processing unit configured to detect a conductive condition established between the first resistor and the second resistor, wherein one terminal of the first resistor in the longitudinal direction thereof is configured to be applied with a first constant voltage and the other terminal of the first resistor is configured as a first voltage detecting position, wherein one terminal of the second resistor in the longitudinal direction thereof is configured as a second voltage detecting position and the other terminal of the second resistor is configured to be either connected to ground or applied with a second constant voltage lower than the first constant voltage, and wherein the processing unit detects the conductive condition between the first and the second resistors in accordance with voltage values at the first and the second voltage detecting positions.

According to a second aspect of the invention, there is provided an input method for an input device having: a first resistor and a second resister each having an equal size and shape extending in one direction and arranged in parallel to each other and each having a constant and equal resistance per unit length in longitudinal direction thereof; and a processing unit configured to detect a conductive condition established between the first resistor and the second resistor, the method including: applying a first constant voltage to one terminal of the first resistor in the longitudinal direction thereof; configuring the other terminal of the first resistor as a first voltage detecting position; configuring one terminal of the second resistor in the longitudinal direction thereof as a second voltage detecting position; either connecting the other terminal of the second resistor to ground or applying a second constant voltage lower than the first constant voltage to the other terminal of the second resistor; and detecting the conductive condition between the first and the second resistors in accordance with voltage values at the first and the second voltage detecting positions.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Preferred embodiments of the invention will be described below with reference to the accompanying drawings.

First Embodiment

Figure 1:
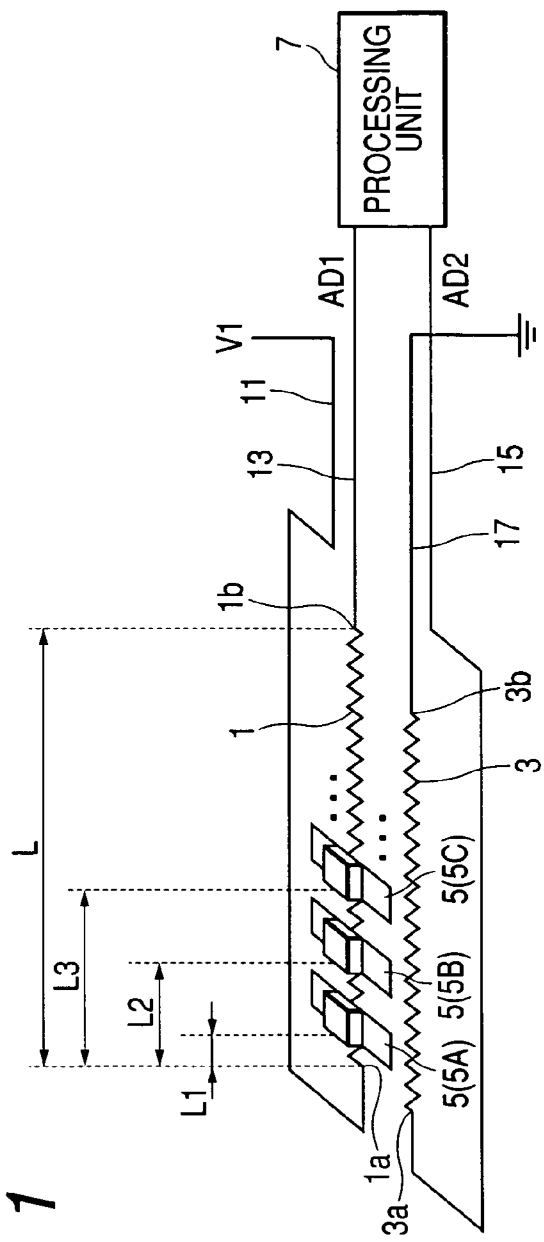
FIG. 1 is a diagram schematically showing the configuration of an input device according to a first embodiment of the invention.

FIG. 1 is a diagram schematically showing the configuration of an input device according to a first embodiment of the invention. The input device is configured to include: a first and a second resistors 1 and 3 of a length L arranged generally in parallel to oppose each other; a plurality of switch elements 5 for conductions between the resistors 1 and 3; and a processing unit 7. Operations through the switch elements 5 are accepted when the processing unit 7 detects the conductive conditions of the individual switch elements 5 on the basis of an input signal.

The two resistors 1 and 3 are formed to extend long in one direction (e.g., in a linear form) and to have a constant equal resistance per unit area. One terminal 1*a* of the resistor 1 is connected through a wiring 11 with the not-shown power circuit and is applied with a predetermined constant voltage V1 (i.e., a first constant voltage). The other terminal 1*b* of the resistor 1 is set as a first voltage detecting position and is connected with the processing unit 7 through a wiring 13 so that a voltage value AD1 of the terminal 1*b* is detected by the processing unit 7. One terminal 3*a* of the resistor 3, i.e., the terminal in the same direction as the one terminal 1*a* of the resistor 1 is set as a second voltage detecting position and is connected with the processing unit 7 through a wiring 15 so that its voltage value AD2 is detected by the processing unit 7. The other terminal 3*b* of the resistor 3 is connected with the ground through a wiring 17. Here in the first embodiment, the other terminal 3*b* of the resistor 3 is connected with the ground but may also be applied with a constant voltage (i.e., a second constant voltage) V2 lower than the constant voltage V1 applied to the one terminal 1*a* of the resistor 1.

The switch elements 5 are arrayed in the longitudinal direction of the resistors 1 and 3. Moreover, the individual switch elements 5 are disposed to cross the two resistors 1 and 3. The switch elements 5 come, when pushed, into electric contact with the resistors 1 and 3 to conduct the resistors 1 and 3 electrically, and go away from the resistors 1 and 3 as they are released from the pushing operations. In other words, while the individual switch elements 5 are being pushed, the portions of the resistors 1 and 3, as corresponding to the switch element 5 being pushed, are made conductive indirectly through the pushed switch element 5.

In a case where none of the switch elements 5 is pushed (or turned ON), therefore, the resistors 1 and 3 are electrically disconnected from each other. At this time, the voltage value AD1 of the other terminal 1*b* of the resistor 1 is equal to the constant voltage V1, and the voltage value AD2 of the one terminal 3*a* of the resistor 3 is at the ground level. In a case where any of the switch elements 5 is pushed, moreover, the resistors 1 and 3 are made conductive through the pushed switch element 5 so that the voltage values AD1 and AD2 change according to the position of the switch element 5 pushed.

In the first embodiment, therefore, each of the switch elements 5 is set at a predetermined position on the resistors 1 and 3. It is decided on the basis of the changing conditions of the voltage values AD1 and AD2 whether or not each switch element 5 is operated and which switch element 5 is operated. For example, the distances of switch elements 5A, 5B and 5C from the one-side terminals 1*a* and 3*a* of the resistors 1 and 3 are set to L1, L2 and L3, respectively.

Here, the first embodiment is configured to detect the voltage values AD1 and AD2 of the other terminal 1*b* of the resistor 1 and the one terminal 3*a* of the resistor 3 while the one terminal 1*a* of the resistor 1 being applied with the constant voltage V1 and while the other terminal 3*b* of the resistor 3 being connected with the ground. When the switch element 5 is operated so that the resistors 1 and 3 are made conductive through the switch element 5, therefore, the partial voltage from the one terminal 1*a* of the resistor 1 to that switch element 5 and the partial voltage of the portion of the resistor 3 from that switch element 5 to the other terminal 3*b* can be precisely grasped without the influence of the contact resistance between the resistors 1 and 3 through the switch element 5.

Here, the first embodiment is provided with the switch elements 5 and is configured such that the switch element 5 is made, when pushed, conductive to the resistors 1 and 3 so that the resistors 1 and 3 are made conductive indirectly through the switch element 5. In a modification, however, the switch elements 5 are eliminated, and the pushing operation is done in a direction to narrow the gap between the resistors 1 and 3. One resistor 1 or 3 pushed is elastically deformed locally in the direction to come closer to the other resistor 1 or 3 so that the resistors 1 and 3 may be made locally and directly conductive. Also in the case above, one resistor 1 or 3 restores its initial shape in a self-sustaining manner to leave the other resistor 1 or 3 thereby to release the conduction between the resistors 1 and 3.

The processing unit 7 is provided with: a voltage detecting function to detect the voltage value AD1 of the one terminal 1*a* of the resistor 1 and the voltage value AD2 of the other terminal 3*b* of the resistor 3; a decision processing function to decide the operating states of the individual switch elements 5 on the basis of the voltage values AD1 and AD2 detected; and an output function to output the decision results to the outside. The processing unit 7 can be conceived to have a variety of specific configurations. For example, the processing unit 7 may be configured by combining an analog detecting element for voltage detection and an operation deciding element, by using a customized IC, or by using a general-purpose microcomputer having an analog input port for accepting the input of a voltage signal.

Here, the circuit relating to the detections of the voltage values AD1 and AD2 is desirably provided with an electromagnetic noise countermeasure circuit and an electrostatic countermeasure circuit in accordance with the using circumstances.

Figure 2:
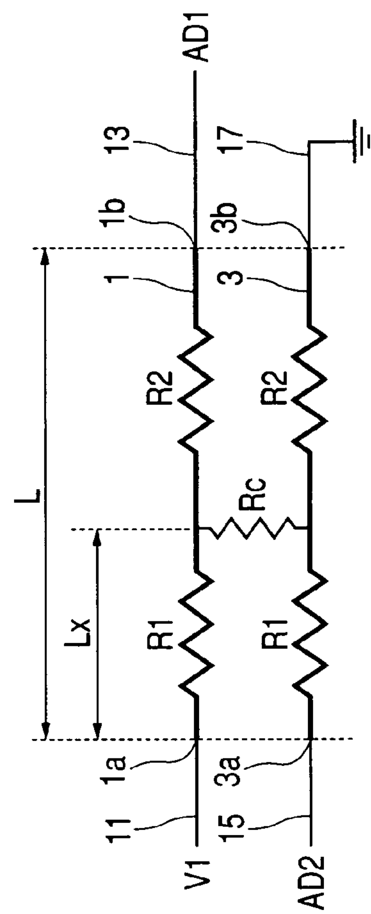
FIG. 2 is a diagram schematically showing the circuit configuration at the time of conduction between resistors.

FIG. 2 is a diagram schematically showing the circuit configuration at the time of conduction between the resistors 1 and 3. FIG. 2 corresponds to the state, in which the switch element 5 at the position of distance Lx from the one terminal 1*a* or 3*a* of the resistor 1 or 3 is pushed to establish the conduction between the resistors 1 and 3. In FIG. 2: characters R1 designate the resistance of the portion at the position of the distance Lx from the one terminal 1*a* or 3*a* of the resistor 1 or 3; characters R2 designate the resistance of the portion from the position of distance Lx of the resistor 1 or 3 to the other terminal 1*b* or 3*b*; and characters Rc designate a contact resistance between the resistors 1 and 3 through the switch element 5. Here in the general case, the input impedance to the processing unit 7 for the voltage detection is set so sufficiently high that the current to flow to the processing unit 7 through the wirings 13 and 15 will be ignored in the following discussions.

In the conductive state, the following relations hold among the variables L, Lx, R1, R2, V1, V2, AD1 and AD2, for example, if the other terminal 3*b* of the resistor 3 has the voltage value V2.

$$Lx:L=R1:(R1+R2)=(V1-AD1):(V1-AD1+AD2-V2) \tag{1}$$

The above relations can be used to specify the switch element 5 being operated. Here in the first embodiment, the other terminal 3*b* of the resistor 3 is connected with the ground so that the voltage value V2 is 0.

From the aforementioned Formula (1), for example, the following relation can be obtained for V2=2.

$$\frac{Lx}{L}=\frac{(V1-AD1)}{(V1-AD1+AD2)} \tag{2}$$

By using the above relation, the value (i.e., the position calculating value) of Lx/L may be calculated from the known value V1 and the measured values AD1 and AD2 thereby to specify the switch element 5 being operated, on the basis of the calculated value.

Here, the aforementioned Formulas (1) and (2) are nothing but an example. Various relations can be conceived as those that can specify the switch element 5 by using the known value V1 and the measured values AD1 and AD2. For V2=0, another example is as follows:

$$\frac{Lx}{L-Lx}=\frac{R1}{R2}=\frac{(V1-AD1)}{AD2} \tag{3}$$

By using the above relations, the value (i.e., the position calculating valve) of Lx/(L−Lx) may be calculated to specify the position of the switch element 5 being operated, on the basis of the calculated value.

Between the voltage values V1, AD1 and AD2 and the resistances R1, R2 and Rc, moreover, the following relation holds.

$$AD1-AD2=\frac{Rc}{R1+R2+Rc}\times V1 \tag{4}$$

On the basis of the difference between the voltage values AD1 and AD2, therefore, it is possible to decide whether or not the switch element 5 is in the stable contact state.

Figure 3:
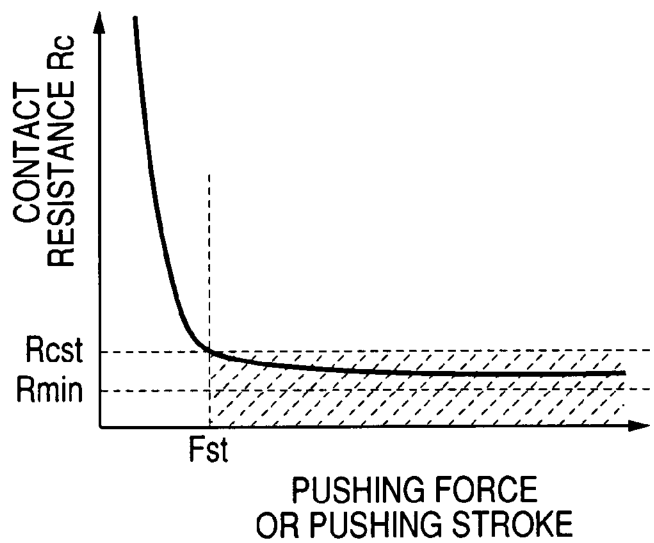
FIG. 3 is a graph showing a relation between the pushing force or pushing stroke at the operation time and a contact relation between the resistors.

Specifically, the contact resistance Rc changes, as plotted in the graph of FIG. 3, against the pressing force, the pressing stroke or the line to the switch element 5, so that the contact resistance Rc (the switch element 5) comes into a stable contact state (as hatched in FIG. 3) when a pressing force or the like at a constant value (Fst) or hither is applied thereto. Therefore, the aforementioned Formula (4) is rewritten into the following Formula, if the upper limit of the contact resistance Rc for decision of the stable contact state is designated by Rcst and if the value of (AD1−AD2) for the contact resistance Rc at Rcst is designated Vst (i.e., a predetermined value or a first reference value according to the invention).

$$AD1-AD2=\frac{V1\times(Rcst)}{(R1+R2+Rcst)}=Vcst \tag{5}$$

From the above Formula, it can be decided that the switch element 5 is in the stable contact state, if the value of (AD1−AD2) satisfies the following relation.

$$AD1-AD2\leqq Vst \tag{6}$$

Here, the value Rmin in FIG. 3 will be described in connection with the later-described third embodiment.

Next, the process to detect the switch position of the processing unit 7 will be described with reference to FIG. 4. The following operations are processed by the processing unit 7. At first, the voltage values AD1 and AD2 are detected in step S1. At subsequent step S2, it is decided whether or not the value of (AD1−AD2) is no more than Vst, that is, whether or not any switch element 5 is operated into the stable contact state, and accordingly which switch element 5 is operated (or turned ON). Then, the routine advances to step S3, in case it is decided that any switch element 5 has been operated, but returns to step S1, in case it is decided that no switch element 5 has been operated. The operations of steps S1 and S2 are repeated till any switch element 5 is operated.

Here, in a case where the operation of the switch element 5 is not detected in step S2, a signal indicating no switch operation may be outputted to an external device.

In step S3, the value of Lx/L is calculated by the aforementioned Formula (2) on the basis of the voltage values AD1 and AD2 detected and the known voltage value V1 registered in advance in the processing unit 7.

Figure 5:
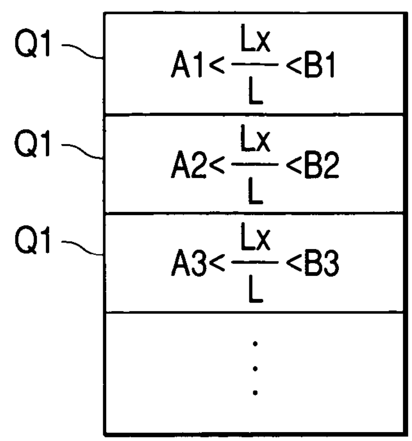
FIG. 5 is a diagram showing a table configuration for switch position decisions.

In subsequent step S4, it is specified on the basis of the position calculating value Lx/L calculated which switch element 5 has been operated, and a signal corresponding to the switch element 5 specified is outputted to the external device. In more detail, a switch position deciding table Ti, as shown in FIG. 5, is registered in advance in the processing unit 7. In the table T1, a plurality of calculation value sections Q1 corresponding one-by-one to the switch elements 5 are set to match the values that can be taken by the position calculating value Lx/L. Each calculation value section Q1 is defined by predetermined lower limits (A1, A2, A3, . . . ) and upper limits (B1, B2, B3, . . . ), and is preferably set with such a predetermined width as to cause no erroneous detection while considering dispersions or the like of the voltage values AD1 and AD2 due to the influences of the electromagnetic noises or the manufacturing dispersions. Here, each calculation value section Q1 may be set on the basis of either theoretical calculation results or the measured values that are obtained from tests by operating the individual switch elements 5 actually.

By deciding which of the calculation sections Q1 the position calculating value Lx/L calculated in step S3 belongs to, moreover, it is decided which switch element 5 has been operated. At this step S4, a signal indicating that the specified switch element 5 has been operated (or turned ON) may be outputted to the external device.

When the operation of step S4 was ended, the routine returns again to step S1, and the operations of steps S1 to S4 are repeated so that the operations of the switch element 5 are detected.

Here, in the aforementioned steps S3 and S4, the switch position is detected on the basis of the relation of the aforementioned Formula (2). However, the detection of the switch position may be done by using a relational formula such as the aforementioned Formula (3) other than Formula (2).

In order to prevent the erroneous actions from being is caused by the electromagnetic noises or the chattering influences, moreover, the voltage values AD1 and AD2 may also be averaged as the soft-like filtering operations at the time of detecting the voltage values AD1 and AD2 in step S1 or the like. Alternatively, in a case where the operations from step S1 to step S4 for detecting the switch positions are done a plurality of times so that the switch positions detected at the individual times are identical, the detection result of the switch positions may also be outputted as definite ones to the external device. The software-like filtering operation may also be applied to the later-described second to eighth embodiments.

According to the first embodiment, as has been described hereinbefore, when the switch element 5 was operated to make the resistors 1 and 3 conductive therethrough, the partial voltage of the portion from the one terminal 1*a* of the resistor 1 to that switch element 5, the partial voltage of the portion of the resistor 3 from that switch element 5 to the other terminal 3*b* and so on can be precisely grasped without the influences of the contact resistance between the resistors 1 and 3 through the switch element 5, thereby to precisely specify which switch element 5 has been operated.

Moreover, the predetermined position calculating value (e.g., Lx/L) for specifying the switch element 5 operated can be easily calculated from the relations among the variables L, Lx, V1, AD1 and AD2.

By deciding whether or not the value of (AD1−AD2) is no more than Vst, moreover, it is easily decided with a high reliability whether or not the switch element 5 has been operated.

Only in a case where it has been decided that the switch element 5 was operated on the basis of the value of (AD1−AD2), the predetermined position calculating value for specifying the switch element 5 operated is calculated from the relations among the variables L, Lx, V1, AD1 and AD2, thereby to specify the operated switch element 5. Therefore, it is possible to prevent the operated switch element 5 from being specified while the switch element 5 is not in the stable contact state by such a cause that the operations are insufficient, thereby to improve the reliability of the input acceptance.

Second Embodiment

Figure 6:
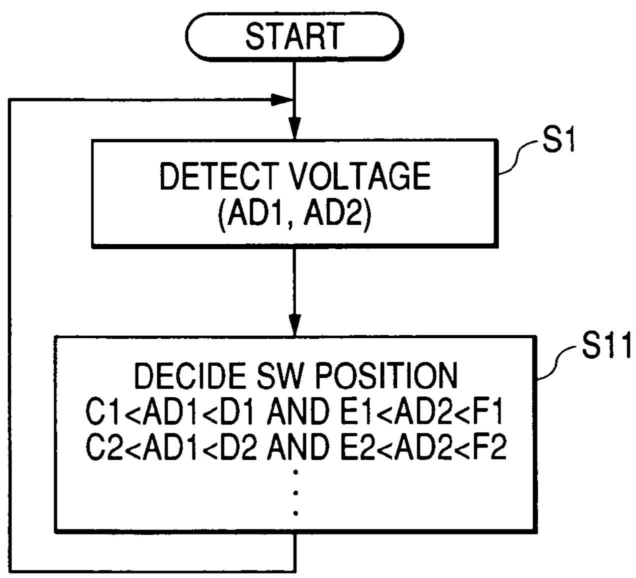
FIG. 6 is a flow chart of an input accepting procedure of an input device according to a second embodiment of the invention.

FIG. 6 is a flow chart of the input accepting procedure of an input device according to a second embodiment of the invention. It is only the processing contents of the processing unit 7 that the input device according to the second embodiment is substantially different from that according to the first embodiment. The description of the input device of this embodiment will be omitted by designating the corresponding portions by the common reference characters.

In the second embodiment, as shown in FIG. 6, the voltage values AD1 and AD2 are detected at first (in step S1) by the processing unit 7. On the basis of the detection result, it is detected whether or not the individual switch elements 5 have been operated, and the detection results are outputted to the external device (in step S11).

Figure 7:
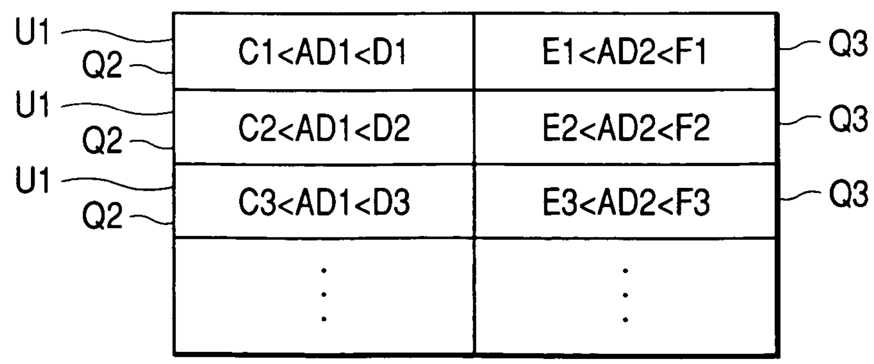
FIG. 7 is a diagram showing a table configuration for the switch position decisions.

The operations of step S11 will be described in more detail. In the processing unit 7, there is registered in advance a switch position deciding table T2, as shown in FIG. 7. In the table T2, a set U1, which is composed of two voltage value sections Q2 and Q3 for defining the range of the values that can be taken by the voltage values AD1 and AD2 when each switch element 5 is operated independently, is set to correspond to each switch element 5. The individual voltage value sections Q2 and Q3 are defined by predetermined lower limits (C1, C2, C3, . . . ) and (E1, E2, E3, . . . ) and by predetermined upper limits (D1, D2, D3, . . . ) and (F1, F2, F3, . . . ), and are preferably set with such predetermined widths as to cause no erroneous detection while considering dispersions or the like of the voltage values AD1 and AD2 due to the influences of the electromagnetic noises or the manufacturing dispersions. Here, the individual calculation value sections Q2 and Q3 may be set on the basis of either theoretical calculation results or the measured values that are obtained from tests by operating the individual switch elements 5 actually.

By deciding which of the sets U1 the voltage values AD1 and AD2 detected in step S1 belong to the voltage value sections Q2 and Q3, moreover, it is detected whether or not the switch element 5 has been operated and which switch element 5 has been operated. Only in a case where the voltage values AD1 and AD2 detected belong to the voltage value sections Q2 and Q3 of a common one U1 of the sets U1 (that is, C1<AD1<D1 and E1<AD2<F1), more specifically, it is decided that the switch operations have been done, and a signal indicating that the switch element 5 corresponding to that set U1 has been operated is outputted to the external device. In another case, that is, in a case where the voltage values AD1 and AD2 belong to the voltage value sections Q2 and Q3 of the different sets U1 or in case either or both of the voltage values AD1 and AD2 do not belong to the voltage value sections Q2 and Q3 of any set U1, a signal indicating no switch operation is outputted to the external device.

Also in the second embodiment, the operating states of the switch elements 5 are detected.

In the second embodiment, as has been described hereinbefore, by the simple deciding operations to decide which the detected voltage values AD1 and AD2 belong to the voltage value sections Q2 and Q3 of, it can be easily detected whether or not the switch operations have been done and which switch element 5 has been operated.

Third Embodiment

Figure 8:
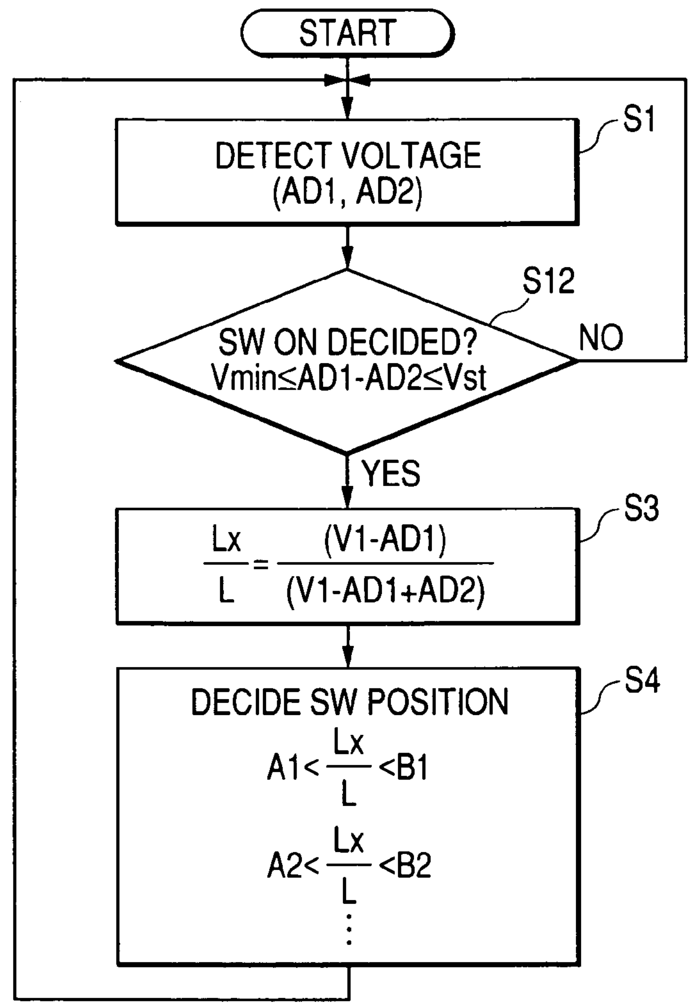
FIG. 8 is a flow chart of an input accepting procedure of an input device according to a third embodiment of the invention.

FIG. 8 is a flow chart of the input accepting procedure of an input device according to a third embodiment of the invention. It is only a portion of the processing contents of the processing unit 7 that the input device according to the third embodiment is substantially different from that according to the first embodiment. The description of the input device of this embodiment will be omitted by designating the corresponding portions by the common reference characters.

In the third embodiment, the input is accepted not in case the switch elements 5 are simultaneously operated (as will be called the "plural operating state (or plural conductive state)" but in a case where one switch element 5 is operated (as will be called the "single operating state (or single conductive state)". Therefore, the decision principle of the plural conductive state and the single conductive state will be described before the specific processing contents of the processing unit 7.

At first, the reference resistance Rmin (wherein Rmin<Rcst) or a value smaller than the contact resistance Rc for the stable contact state is introduced, as shown in FIG. 3. The value Vmin of (AD1−AD2) is given, as follows, by the aforementioned Formula (4), if the contact resistance Rc is the reference resistance Rmin.

$$AD1 - AD2 = \frac{V1 \times (R\mathrm{min})}{(R1 + R2 + R\mathrm{min})} = V\mathrm{min} \tag{7}$$

In the third embodiment, it is decided by using this value Vmin (or the second reference value) whether the operating state is plural or single. More specifically, the decision is based on the following principle.

Figure 9:
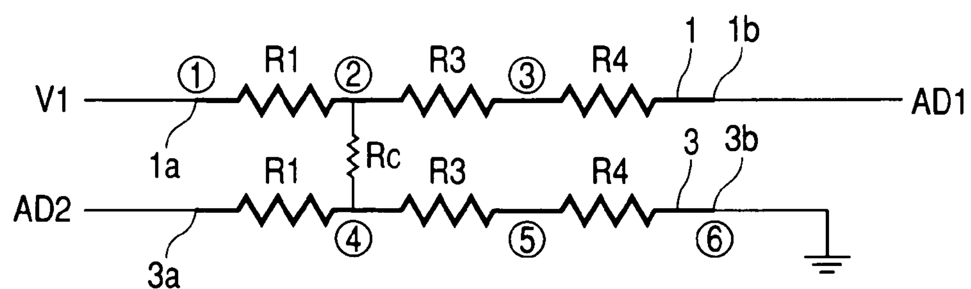
FIG. 9 is a diagram schematically showing a circuit configuration when the conduction between the resistors occurs at one portion.
Figure 10:
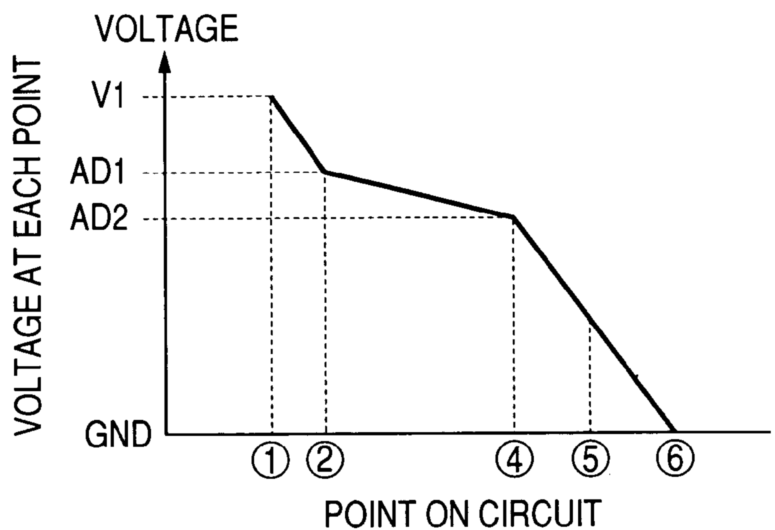
FIG. 10 is a diagram showing the voltage values of individual points on the circuit of FIG. 9.
Figure 11:
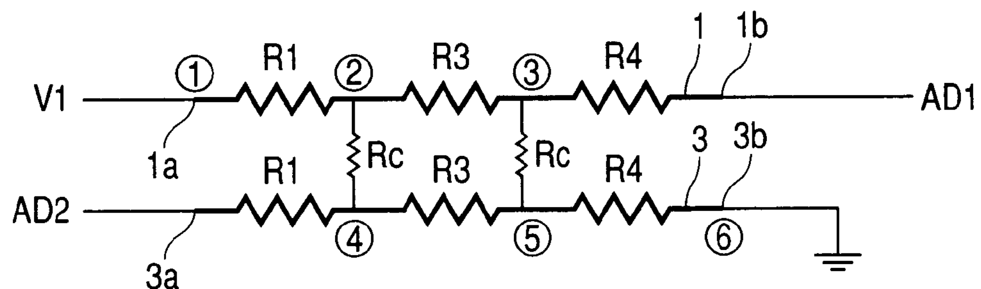
FIG. 11 is a diagram schematically showing a circuit configuration when the conduction between the resistors occurs at two portions.
Figure 12:
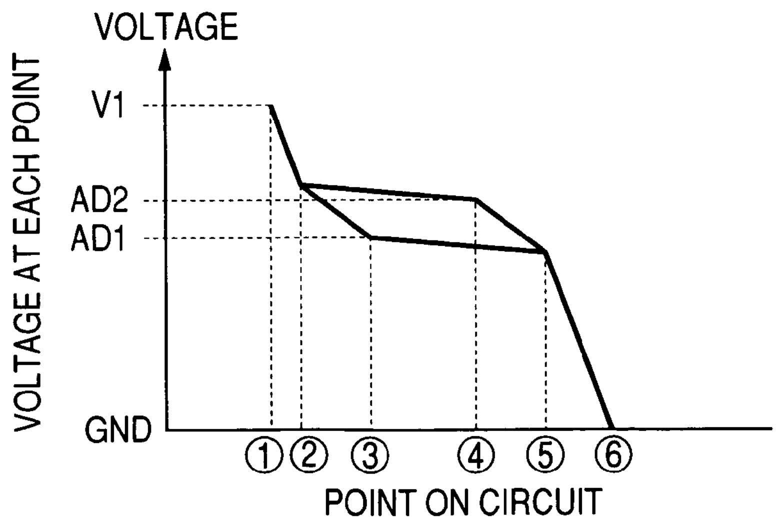
FIG. 12 is a diagram showing the voltage values of individual points on the circuit of FIG. 11.

FIG. 9 is a diagram schematically showing a circuit configuration of the resistors 1 and 3 in the single operating state. FIG. 10 is a diagram showing the voltage values at the individual points on the circuit of FIG. 9. FIG. 11 is a diagram schematically showing a circuit configuration of the resistors 1 and 3 in the plural operating state, in which the two switch elements 5 are simultaneously operated. FIG. 12 is a diagram showing the voltage values at the individual points on the circuit of FIG. 11. In FIG. 9 and FIG. 11, characters R1 to R4 designate divided resistances at the corresponding individual portions of the resistors 1 and 3. FIG. 12 shows the case, in which the contact resistance Rc is smaller than the divided resistance R3.

In a case where Rc<R3 stands in the plural operating state, AD1−AD2<0 stands, as shown in FIG. 12. It is, therefore, possible to easily decide that the plural conductive state has occurred. Here in the single operating state, AD1−AD2>0 stands, as shown in FIG. 10.

In a case where Rc≧R3 stands in the plural operating state, on the other hand, AD1−AD2≧0 stands. However, the value of (AD1−AD2) in the plural operating state is smaller than the value of (AD1−AD2) in the single operating state. By setting the aforementioned reference value Vmin properly, therefore, the reference single operating state and the plural operating state can be decided from the magnitude relation between the value of (AD1−AD2) and the reference value Vmin. Specifically, the plural operating state can be judged in case the value of (AD1−AD2) is smaller than the reference value Vmin.

Here, whether or not the switch element 5 has been operated can be decided, as in the case of the aforementioned first embodiment, from the magnitude relation between the value of (AD1−AD2) and the reference value Vst.

Figure 4:
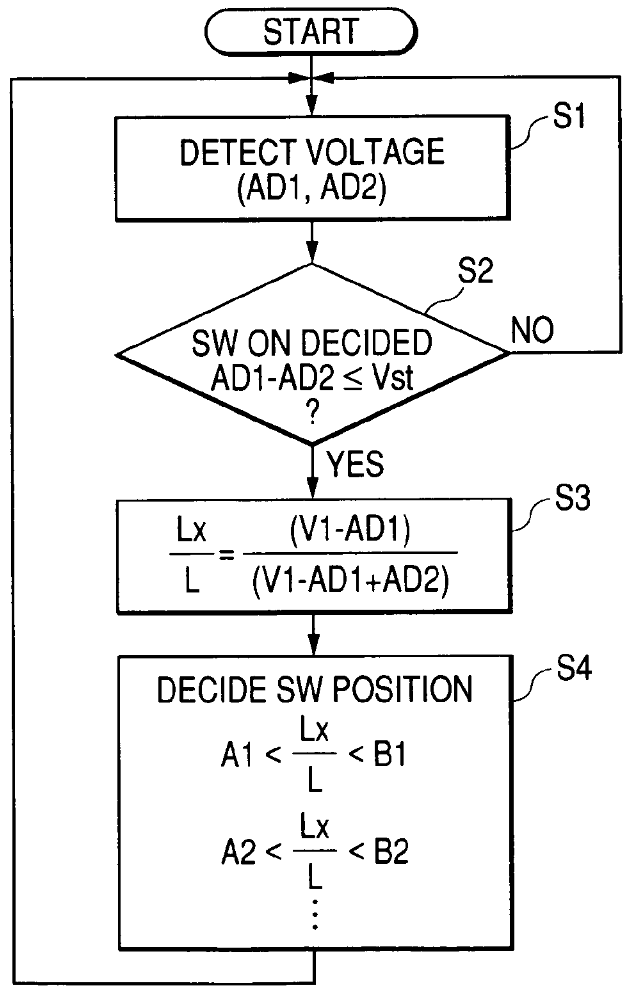
FIG. 4 is a flow chart of an input accepting procedure by the input device of FIG. 1.

In the input accepting procedure of the processing unit 7 according to the third embodiment, therefore, the operation of step S12 is done in place of the aforementioned operation of step S2 of FIG. 4, as shown in FIG. 8. Here, the processing contents other than the operation of step S12 are identical to the aforementioned ones of FIG. 4 so that their description will be omitted.

In step S12, it is decided whether or not the difference of (AD1−AD2) between the voltage values AD1 and AD2 detected in step S1 is within a range from the reference value Vmin to the reference value Vst. Within the range, it is decided that the switch operation has been done, and the routine advances to step S3. Outside the range, it is decided that the switch operation has not been done, and the routine returns to step S1.

According to the third embodiment, therefore, it is possible to prevent the switch element 5 operated from being erroneously specified by a misjudgment that the switch element 5 has been operated, although a plurality of switch elements 5 have been operated.

Fourth Embodiment

Figure 13:
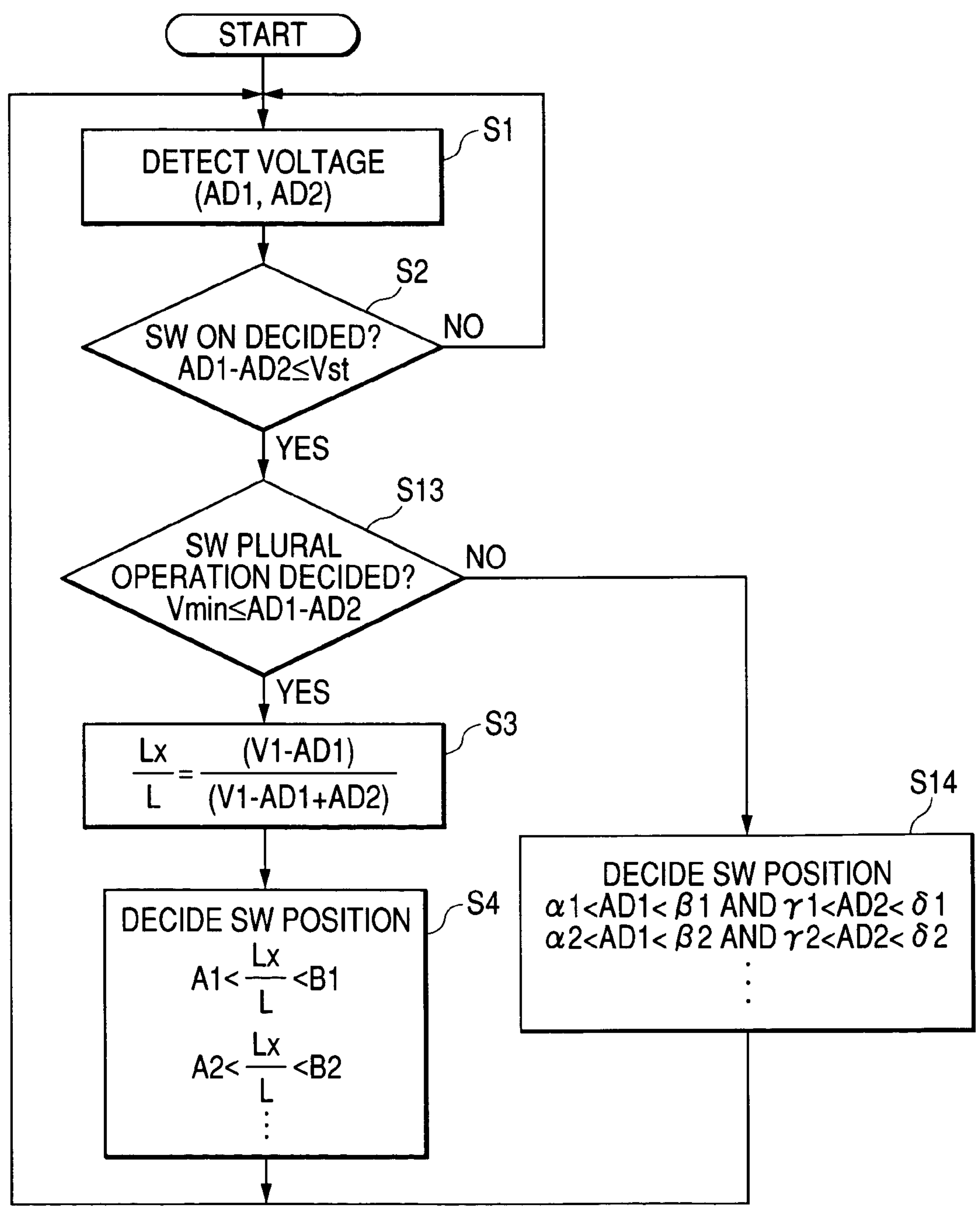
FIG. 13 is a flow chart of an input accepting procedure of an input device according to a fourth embodiment of the invention.

FIG. 13 is a flow chart of the input accepting procedure of an input device according to a fourth embodiment of the invention. It is only a portion of the processing contents of the processing unit that the input device according to the fourth embodiment is substantially different from that according to the first embodiment. The description of the input device of the fourth embodiment will be omitted by designating the corresponding portions by the common reference characters.

In the fourth embodiment, in order to specify the switch element 5 being operated in the plural conductive state, a new step S13 is interposed between the aforementioned step S2 and step S3 of FIG. 4, and step S14 is accordingly added. As a result, it is possible to decide whether or not the switch operation has been done, to specify the switch element 5 being operated in the single operating state, and to specify the individual switch elements 5 being operated in the plural operating state.

In a case where it is decided in step S2 that the switch operation has been done, the routine advances to step S13, at which it is judged whether or not the value of (AD1−AD2) is the reference value Vmin or less, thereby to judge whether the operating state of the switch element 5 is single or plural. In a case where the single operating state is judged, the routine advances to step S3, at which operations like the aforementioned ones are done to specify the switch element 5 being operated. In a case where the plural operating state is judged, the routine advances to step S14.

In step S14, it is decided from the following principle on the basis of the voltage values AD1 and AD2 detected in step S1 which of the switch elements 5 has been operated. The detection result is outputted to the external device, and the routine returns to step S1.

Figures 14, 15:
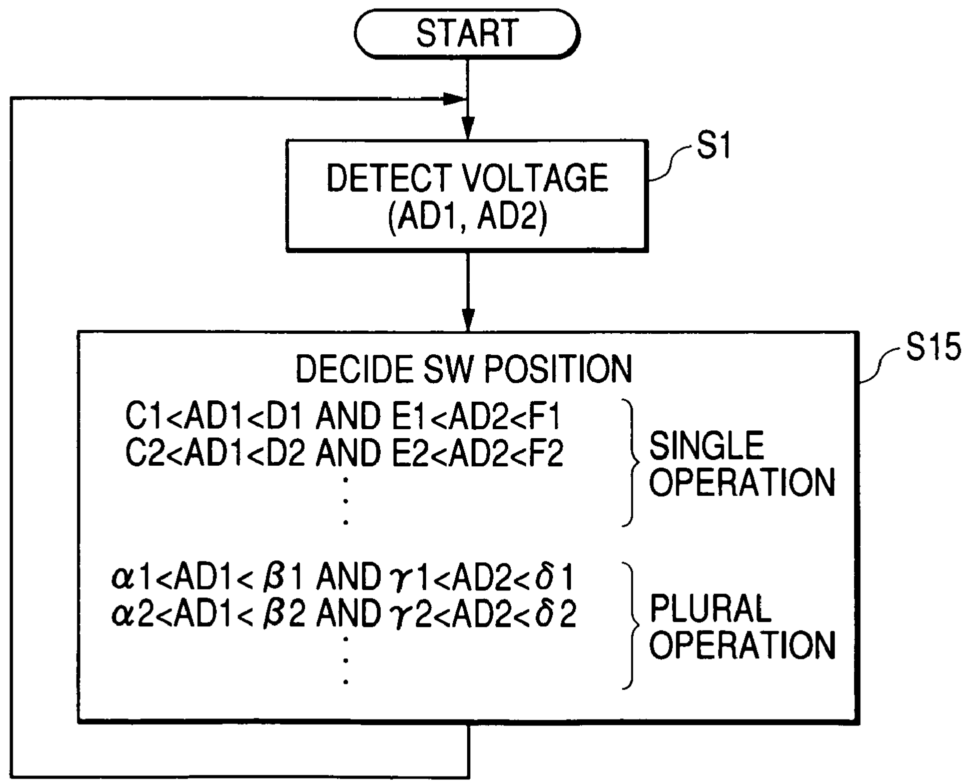
FIG. 14 is a diagram showing a table configuration for the switch position decisions.
FIG. 15 is a flow chart of an input accepting procedure of an input device according to a fifth embodiment of the invention.

The operations of step S14 will be described in more detail. In the processing unit 7, a switch position deciding table T3 is registered in advance, as shown in FIG. 14. In the table T3, a set U2, which is composed of two voltage value sections Q4 and Q5 for defining the range of the values that can be taken by the voltage values AD1 and AD2 when the switch elements 5 are simultaneously operated, is set in the number of kinds of combination modes of the switch elements 5 operated and to correspond to the individual combination modes. The individual voltage value sections Q4 and Q5 are defined by predetermined lower limits (α1, α2, $\alpha 3, \ldots$ ) and ($\gamma 1$, $\gamma 2$, $\gamma 3$, . . . ) and by predetermined upper limits ($\beta 1$, $\beta 2$, $\beta 3$, . . . ) and ($\delta 1$, $\delta 2$, $\delta 3$, . . . ), and are preferably set with such predetermined widths as to cause no erroneous detection while considering dispersions or the like of the voltage values AD1 and AD2 due to the influences of the electromagnetic noises or the manufacturing dispersions. Here, the individual calculation value sections Q4 and Q5 may be set on the basis of either theoretical calculation results or the measured values that are obtained from tests by operating the individual switch elements 5 actually.

In a case where the two switch elements 5 are simultaneously operated, as shown in FIG. 11, so that the conduction occurs at two portions between resistors 1 and 3, for example, the voltage values AD1 and AD2 are univocally determined by the following Formulas (8) and (9).

$$AD1 = \frac{V1 \times R4}{\left(R1 + R4 + \frac{R3 + Rc}{2}\right)} + \frac{\Omega \times Rc}{(R3 + Rc)} \quad (8)$$

$$AD2 = \frac{V1 \times R4}{\left(R1 + R4 + \frac{R3 + Rc}{2}\right)} + \frac{\Omega \times R3}{(R3 + Rc)} \quad (9)$$

Here, Ω is expressed, as follows:

$$\Omega = \frac{V1 \times \left(R4 + \frac{R3 + Rc}{2}\right)}{\left(R1 + R4 + \frac{R3 + Rc}{2}\right)} - \frac{V1 \times R4}{\left(R1 + R4 + \frac{R3 + Rc}{2}\right)} \quad (10)$$

Specifically, the distances from the one terminal 1*a* or 3*a* of the resistor 1 or 3 to the individual switch elements 5 are known. By predicting the values of the contact resistance Rc in advance, therefore, which combination mode the two of the switch elements 5 have been operated in can be decided from the voltage values AD1 and AD2 detected. Therefore, the voltage value sections Q4 and Q5 of each aforementioned set U2 can be set, too, by using the aforementioned Formulas (8) and (9).

In a case where three or more switch elements 5 have been simultaneously operated, they can be decided in a similar manner from the voltage values AD1 and AD2.

In the actual deciding operation in the step S14, which combination mode the switch elements 5 have been operated in can be detected by deciding which of the sets U2 the voltage values AD1 and AD2 detected in step S1 belong to the voltage value sections Q4 and Q5 thereof. Only in a case where the detected voltage values AD1 and AD2 belong to the voltage value sections Q4 and Q5 of the common one of the sets U2 (as in case $\alpha 1$<AD1<$\beta 1$ and $\gamma 1$<AD2<$\delta 1$), more specifically, a signal indicating that the switch elements 5 have been operated in the combination mode corresponding to that set U2 is outputted to the external device. In another case, that is, in a case where the voltage values AD1 and AD2 belong to the voltage value sections Q4 and Q5 of sets U2 different from each other or in case the voltage values AD1 and/or AD2 do not belong to the voltage value sections Q4 and Q5 of any set U2, a signal indicating that the switch operation has not been done is outputted to the external terminal.

Also in the fourth embodiment, the operating states of the switch elements 5 are detected by repeating the operations of the individual steps shown in FIG. 13 along their flow.

As has been described hereinbefore, the fourth embodiment can achieve advantages similar to the is aforementioned advantages of the first embodiment. Even in a case where the switch elements 5 have been simultaneously operated, moreover, which switch element 5 has been operated can be decided on the basis of the voltage values AD1 and AD2 detected, thereby to accept the various operation inputs.

Moreover, whether the operating state of the switch elements 5 is single or plural is decided on the basis of the value of (AD1−AD2), and the operated switch element 5 is decided separately for the cases of the single operating state and the plural operating state. Therefore, it is possible to decide the operated switch element 5 accurately.

Fifth Embodiment

FIG. 15 is a flow chart of the input accepting procedure of an input device according to a fifth embodiment of the invention. It is only the processing contents of the processing unit 7 that the input device according to the fifth embodiment is substantially different from that according to the first embodiment. The description of the input device of the fifth embodiment will be omitted by designating the corresponding portions by the common reference characters.

In the fifth embodiment, as shown in FIG. 15, the voltage values AD1 and AD2 are detected at first by the processing unit 7 (in step S1). On the basis of this detection result, whether or not the individual switch elements 5 have been operated is detected, and the detection result is outputted to the external device (in step S15).

The operations of step S15 will be described in more detail. In the processing unit 7, the aforementioned switch position deciding tables T2 and T3 of FIG. 7 and FIG. 14 are registered in advance, and which switch element 5 has been operated is decided by using those tables T2 and T3.

Specifically, which set U1 or U2 of the sets U1 and U2 of the tables T2 and T3 the voltage values AD1 and AD2 detected in step S1 belong to the voltage value sections Q2 and Q3, and Q4 and Q5 of is decided to decide whether or not the individual switches have been operated, and the decision result is outputted to the external device.

In a case where the detected voltage values AD1 and AD2 belong to the voltage value sections Q2 and Q3 of the common one U1 of the sets U1 of the table T2 (as in case C1<AD1<D1 and E1<AD2<F1), it is decided that one switch element 5 corresponding to that set U1 has been operated.

In a case where the detected voltage values AD1 and AD2 belong to the voltage value sections Q4 and Q5 of the common one U2 of the sets U2 of the table T3 (as in case $\alpha 1$<AD1<$\beta 1$ and $\gamma 1$<AD2<$\delta 1$), it is decided that the switch elements 5 have been operated in the combination mode corresponding to that set U2.

In another case, that is, in a case where the voltage values AD1 and AD2 belong to the voltage value sections Q2 and Q3, and Q4 and Q5 of the sets U1 and U2 different from each other or in a case where the voltage values AD1 and/or AD2 do not belong to the voltage value sections Q2 and Q3, and Q4 and Q5 of any set U1 or U2, it is decided that the switch operation has not been done.

Also in the fifth embodiment, the operating states of the switch elements 5 are detected by repeating the operations of steps S1 and S15.

In the fifth embodiment, as has been described hereinbefore, by the simple deciding operations to decide which of the sets U1 and U2 the detected voltage values AD1 and AD2 belong to the voltage value sections Q2 and Q3, and Q4 and Q5 of, it can be easily detected whether or not the switch operations have been done and which switch element or elements 5 have been operated.

Sixth Embodiment

Figure 16:
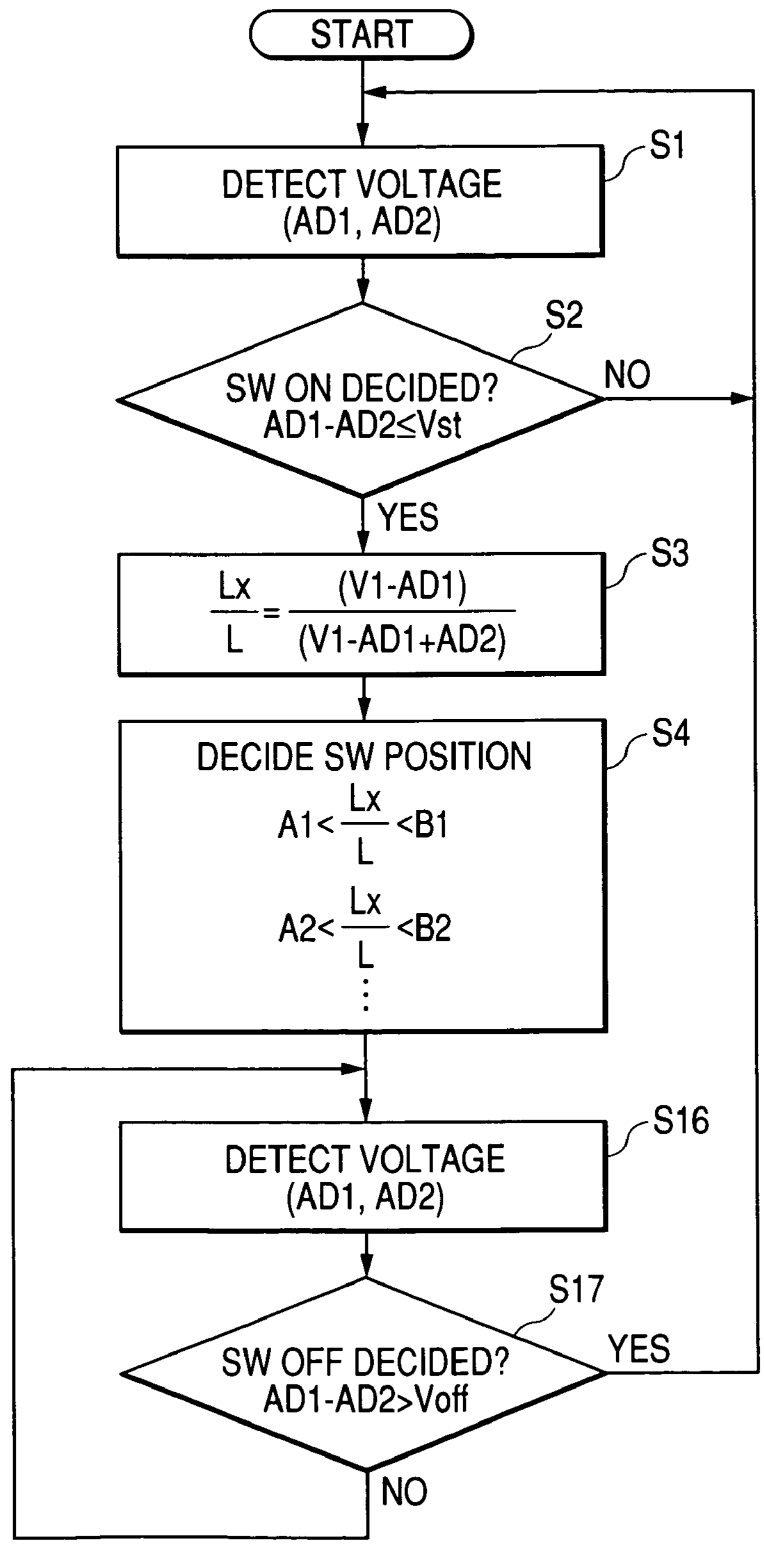
FIG. 16 is a flow chart of an input accepting procedure of an input device according to a sixth embodiment of the invention.

FIG. 16 is a flow chart of the input accepting procedure of an input device according to a sixth embodiment of the invention. It is only the processing contents of the processing unit 7 that the input device according to the sixth embodiment is substantially different from that according to the first embodiment. The description of the input device of the sixth embodiment will be omitted by designating the corresponding portions by the common reference characters.

Before the configuration of the sixth embodiment is specifically described, here will be described the problems to be solved by the sixth embodiment.

Figure 17:
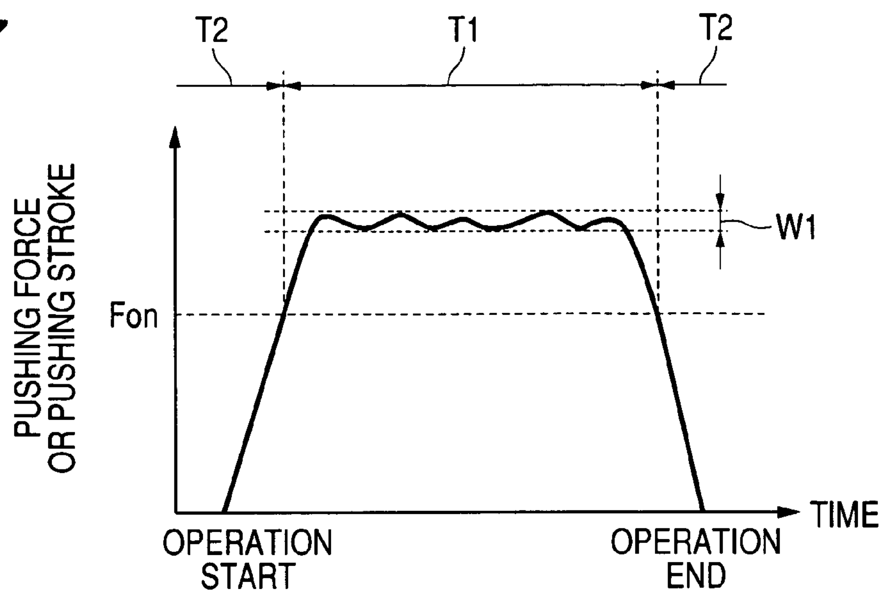
FIG. 17 is a graph showing the behavior of the pushing force or pushing stroke against the time when the operation is done in a sufficient operating intensity.

When the switch elements 5 are pushed, the pushing force or the pushing stroke changes, as shown in FIG. 17, as the time elapses. For example, it is decided that the pushing operation is started (or the switch element 5 is turned ON) in case the pushing force or the pushing stroke (or another corresponding value) exceeds a predetermined reference level (Fon), and it is decided that the pushing operation is ended (or released) (or the switch element 5 is turned OFF) in case the pushing force or stroke is below the reference level (Fon).

Figure 18:
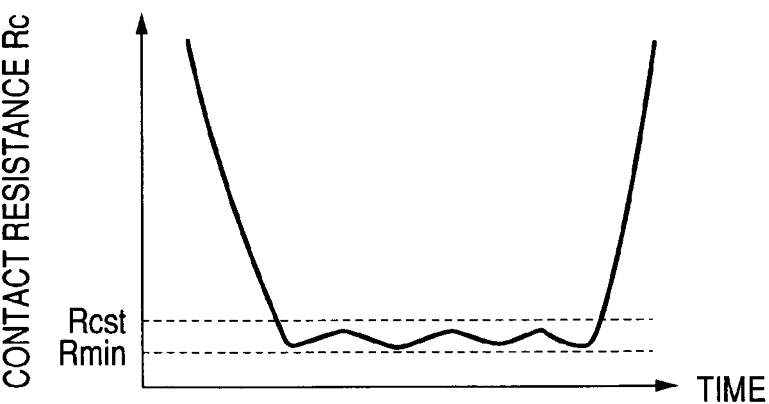
FIG. 18 is a graph showing the behavior of the contact resistance against the time in the operation of FIG. 17.

Here, characters T1 in FIG. 17 designate a time period, for which it is decided that the switch element 5 is ON, and characters T2 designate a time period, for which it is decided that the switch element 5 is OFF. On the other hand, FIG. 18 is a graph showing the behavior of the time change in the contact resistance Rc between the resistors 1 and 3 in the operations of FIG. 17. The resistance Rcst in FIG. 18 is identical to the aforementioned resistance Rcst of FIG. 3 and corresponds to the contact resistance Rc corresponding to the reference level (Fon) against the pushing force. Moreover, the resistance Rmin in FIG. 18 is identical to the aforementioned resistance Rmin shown in FIG. 3.

However, the following problems arise in a case where the start and end of the operations are decided from the aforementioned relations between the pushing force, the pushing stroke or the like and the single reference level (Fon).

Figure 19:
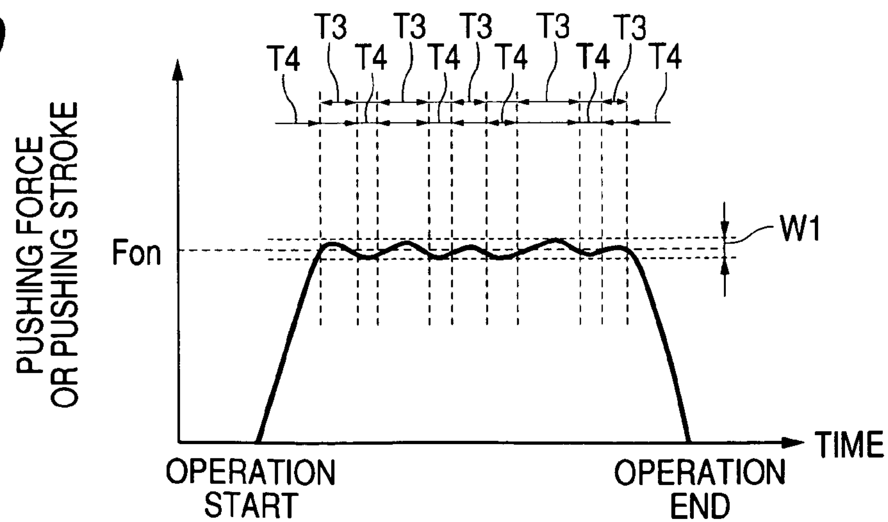
FIG. 19 is a graph showing the behavior of the pushing force or pushing stroke against the time when the operation is done in an operating intensity near a threshold value.
Figure 20:
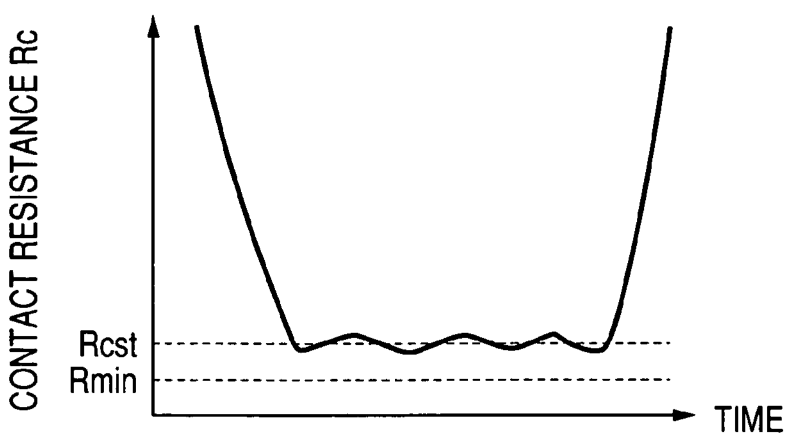
FIG. 20 is a graph showing the behavior of the contact resistance against the time in the operation of FIG. 19.

In a case where the operations have been done in a sufficient pushing intensity exceeding the reference level (Fon), as shown in FIG. 17, the decision that the switch element 5 is ON is retained for the period T1, even if the pushing force or stroke or the like of the pushing operation once exceeds the reference level (Fon) and then reluctantly fluctuates. In a case where these reluctant fluctuations of the pushing force or stroke or the like occur when the pushing operations are done in an intensity near the reference level (Fon), as shown in FIG. 19, the pushing force or stroke or the like varies across the reference level (Fon) so that the intrinsic single operation is erroneously inputted as the plural operations. Here, characters T3 in FIG. 19 designate a time period, for which it is decided that the switch element 5 is ON, and characters T4 designate a time period, for which the switch element 5 is OFF. On the other hand, FIG. 20 is a graph showing the behavior of the time change of the contact resistance Rc between the resistors 1 and 3 in the operations of FIG. 18. Moreover, characters W1 in FIG. 17 and FIG. 19 designate a fluctuation width at the time when the pushing force or the like reluctantly fluctuates during the operations.

Figure 21:
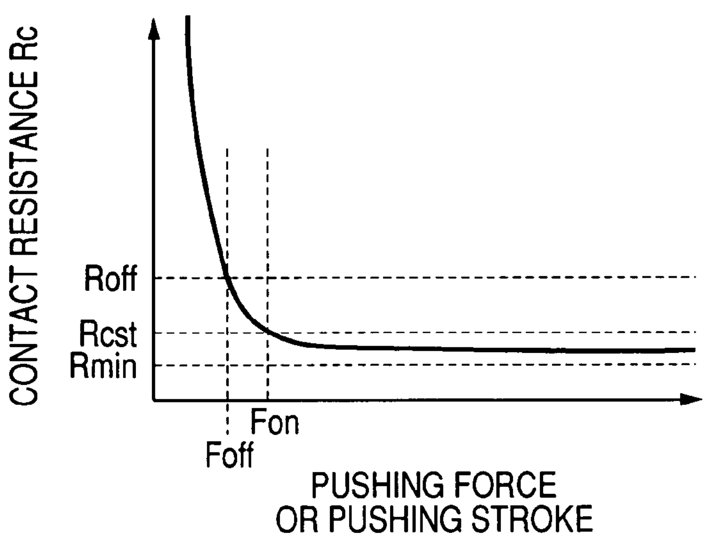
FIG. 21 is a graph showing a relation between the pushing force or pushing stroke at the operation time and a contact relation between the resistors.

In the sixth embodiment, therefore, countermeasures are made against the reluctant fluctuations of the pushing force or the like during the operations by providing the first and second reference levels as a reference for deciding whether or not the operations have been done. As shown in FIG. 21, more specifically, a first reference level (Fon, Rcst and Vst) and a second reference level (Foff, Roff and Voff) are provided as the reference for deciding whether or not the operations have been done.

Here, the first reference level (Fon, Rcst and Vst) is provided for deciding the starting time of the operations, and the second reference level (Foff, Roff and Voff) is provided for deciding the ending time of the operations. Moreover: the reference level (Fon or Foff) is provided for the pushing force or the pushing stroke is of the operations; the reference level (Rcst or Roff) is provided for the contact resistance Rc between the resistors 1 and 3; and the reference level (Vst or Voff) is provided for the subtracted value of (AD1−AD2) of the aforementioned voltage values AD1 and AD2. The first and the second reference levels correspond to each other. When the pushing force or the pushing stroke at the operating time is at the reference level (Fon or Foff), more specifically, the contact resistance Rc between the resistors 1 and 3 is at the reference level (Rcst or Roff), and the subtracted value of (AD1−AD2) of the voltage values AD1 and AD2 is at the reference level (Vst or Voff). Moreover, the relation between the reference level (Rcst) and the reference level (Vst) is given by the aforementioned Formula (5), and the relation between the reference level (Roff) and the reference level (Voff) is given by the following Formula (10).

$$AD1 - AD2 = \frac{V1 \times (Roff)}{(R1 + R2 + Roff)} = Voff \tag{10}$$

Hereinafter, the magnitude relations between the first reference level (Fon, Rcst and Vst) and the second reference level (Foff, Roff and Voff) will be described. The reference level (Fon) and the reference level (Foff) are so set with reference to the reference level (Fon and Foff) for the pushing force or the pushing stroke of the operations that the reference level (Foff) may be lower than the reference level (Fon), as shown in FIG. 21. Accordingly, the reference level (Roff) is higher than the reference level (Rcst), and the reference level (Voff) is higher than the reference level (Vst).

In the sixth embodiment, the set value of the second reference level (Voff) can be arbitrarily taken within a range of Vst<Voff<V1. In order to prevent the erroneous detection of the number of operation times, as might otherwise be caused by the fluctuations of the operation intensity, it is preferable to set the difference between the first reference level (Fon) and the second reference level (Foff) sufficiently large.

In the sixth embodiment, moreover, by using the first and second reference levels (Vst and Voff) to the subtracted value of (AD1−AD2) of the voltage values AD1 and AD2, it is decided whether or not the value of (AD1−AD2) changes from a larger value than the first reference level (Vst) to a smaller value. At the time when the value of (AD1−AD2) becomes smaller than the first reference level (vst), it is decided that the operations of one time have been started (or the switch element 5 has been turned ON). Moreover, it is decided whether or not the value of (AD1−AD2) smaller than the first reference level (Vst) exceeds the second reference level (Voff). When the value of (AD1−

AD2) exceeds the second reference level (Voff), it is decided that the operations of one time have been ended (or the switch element 5 has been turned OFF).

Figure 22:
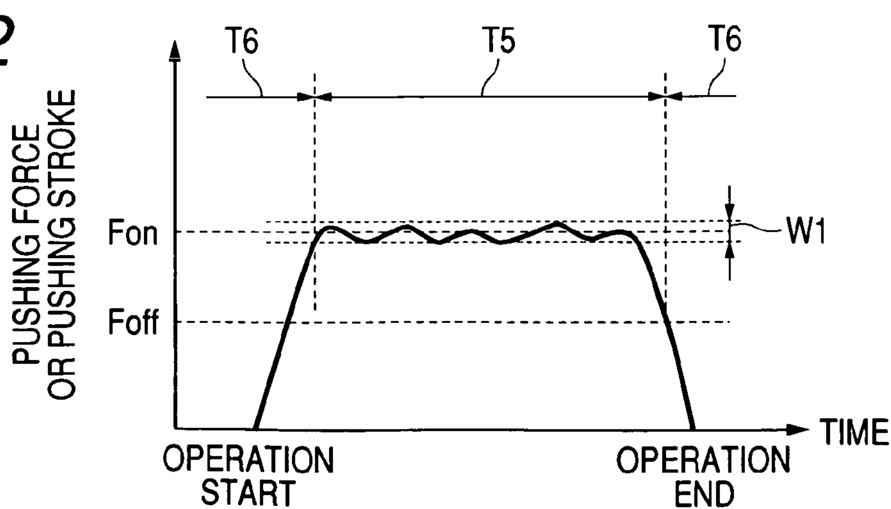
FIG. 22 is a graph showing the behavior of the pushing force or pushing stroke against the time when the operation is done in an operating intensity near the threshold value.

When the operations are done so that the subtracted value of (AD1−AD2) of the voltage values AD1 and AD2 grows smaller than the first reference level (Vst) whereby the start of the operations is detected, therefore, it is decided that the operations are continued till the value of (AD1−AD2) exceeds the second reference level (Voff) larger than the first reference level (Vst). Even in a case where the pushing force or stroke or the like is caused to vary across the first reference level (Fon) by the reluctant fluctuations in a case where the operations are done in a pushing intensity near the first reference level (Fon), as shown in FIG. 22, it is not erroneously decided that a plurality of operations have been done although they are intrinsically single. In FIG. 22, characters T5 designate a time period, for which it is decided that the switch element 5 is ON, and characters T6 designate the time period, for which it is decided that the switch element 5 is OFF.

Figure 23:
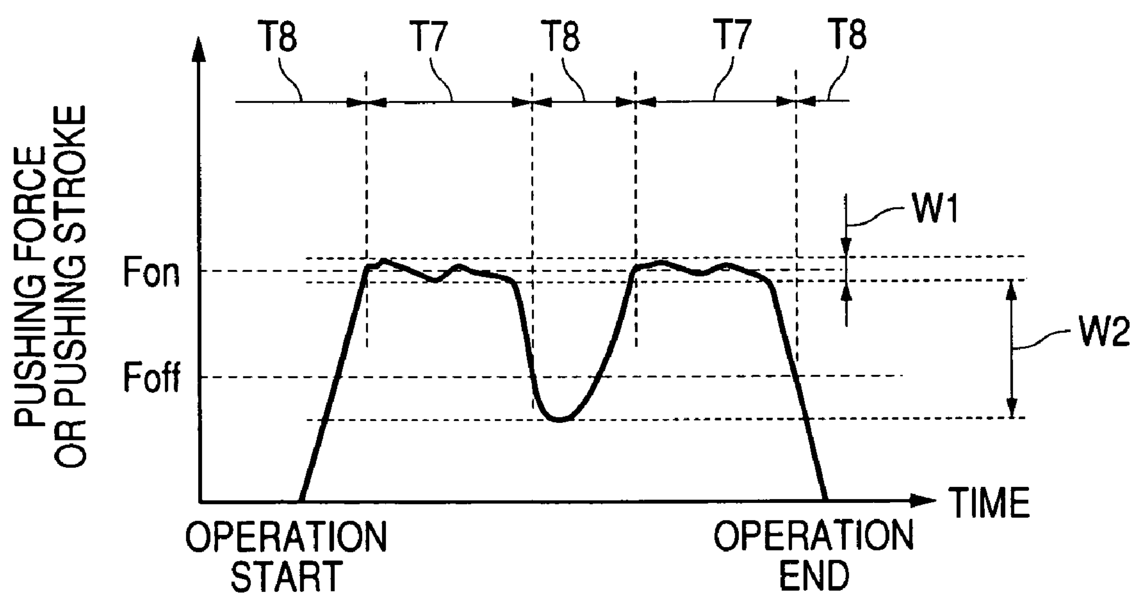
FIG. 23 is a graph showing the behavior of the pushing force or pushing stroke against the time when twice operations are done.

In a case where a plurality of (e.g., two) operations are to be inputted, the operations can be inputted by increasing/decreasing the pushing intensity consciously so that the pushing intensity may be lower than the second reference level (Foff) between the individual operations, as shown in FIG. 23. In FIG. 23, characters T7 designate a time period, for which it is decided that the switch element 5 is ON, and characters T8 designate a time period, for which it is decided the switch element 5 is OFF. Moreover, characters W2 in FIG. 23 designate a conscious increasing/decreasing width of the operating intensity.

Hereinafter, the specific contents of the input accepting operations of the processing unit 7 according to the sixth embodiment will be described. The input accepting operations according to the sixth embodiment have contents, in which the operations of steps S16 and S17 are substantially added to the aforementioned processing contents of FIG. 4, as shown in FIG. 16.

Specifically, the voltage values AD1 and AD2 are detected at first step S1. At subsequent step S2, it is decided whether or not the value of (AD1−AD2) is less than the first reference level (Vst), that is, whether or not the operation of any of the switch elements 5 has been started. And, the routine advances to step S3, in case it is decided that the operation of any switch element 5 has been started, but returns to step S1 in case the operation of any switch element 5 has not been started. The operations of steps S1 and S2 are repeated till the operation of any switch element 5 is started.

In a case where the operation of the switch element 5 is not detected in step S2, a signal indicating no switch operation (or a switch OFF) may be outputted to the external device.

In steps S3 and S4, there are done operations similar to the aforementioned ones of steps S3 and S4 of FIG. 4 to decide what of the aforementioned calculation sections Q1 the position calculating value Lx/L belongs to, thereby to decide which switch element 5 has been operated, and the routine advances to step S16. In step S4, a signal indicating that the switch element 5 specified has been operated (or turned ON) may be outputted to the external device.

In step S16, the voltage values AD1 and AD2 are detected. At subsequent step S17, it is decided whether or not the value of (AD1−AD2) exceeds the second reference level (Voff), that is, whether or not the operation of the switch element 5 having been done till then has been ended. And, the routine returns to step S1, in case it is decided that the operation of the switch element 5 has been ended, but to step S16 in case it is decided that the operation of the switch element 5 has not been ended. The operations of steps S16 and S17 are repeated till the operation of the switch element 5 is ended. A signal indicating the switch operation end (or the switch OFF) may be outputted to the external device, in case it is detected in step S17 that the end of the operation of the switch element 5 has been detected.

The operation of the switch element 5 is detected by repeating those steps S1 to S14, S16 and S17.

In the above-described routine of FIG. 16, the operations of steps S16 and S17 are repeated till the end of the operation is detected in step S17, after the start of the operation was detected in step S2 and after the switch position was detected in steps S3 and S4. For the time period from the detection instant of the operation start to the detection instant of the operation end, therefore, the switch position detection in steps S3 and S4 is done only once at the timing just after the operation start was detected.

As has been described hereinbefore, the sixth embodiment can achieve advantages similar to those of the first embodiment excepting that the two first and second reference levels (Vst and Voff) are used for deciding whether or not the switch element 5 has been operated, and the relating points. When the operation is done so that the subtracted value of (AD1−AD2) of the voltage values AD1 and AD2 becomes smaller than the first reference level (Vst) whereby the operation start of detected, it is decided that the operations are continued till the value of (AD1−AD2) exceeds the second reference level (Voff) higher than the first reference level (Vst). It is, therefore, possible to prevent the erroneous decision, as might otherwise be made by the reluctant fluctuations of the pushing force, the pushing stroke and so on, that a plurality of operations have been done although they are intrinsically single.

In the sixth embodiment, moreover, for the time period from the detection instant of the operation start to the detection instant of the operation end, the switch position detection in steps S3 and S4 is done only once at the timing just after the operation start. Therefore, the sixth embodiment is suited for the case, in which only one switch position detection is done for a single operation.

Seventh Embodiment

Figure 24:
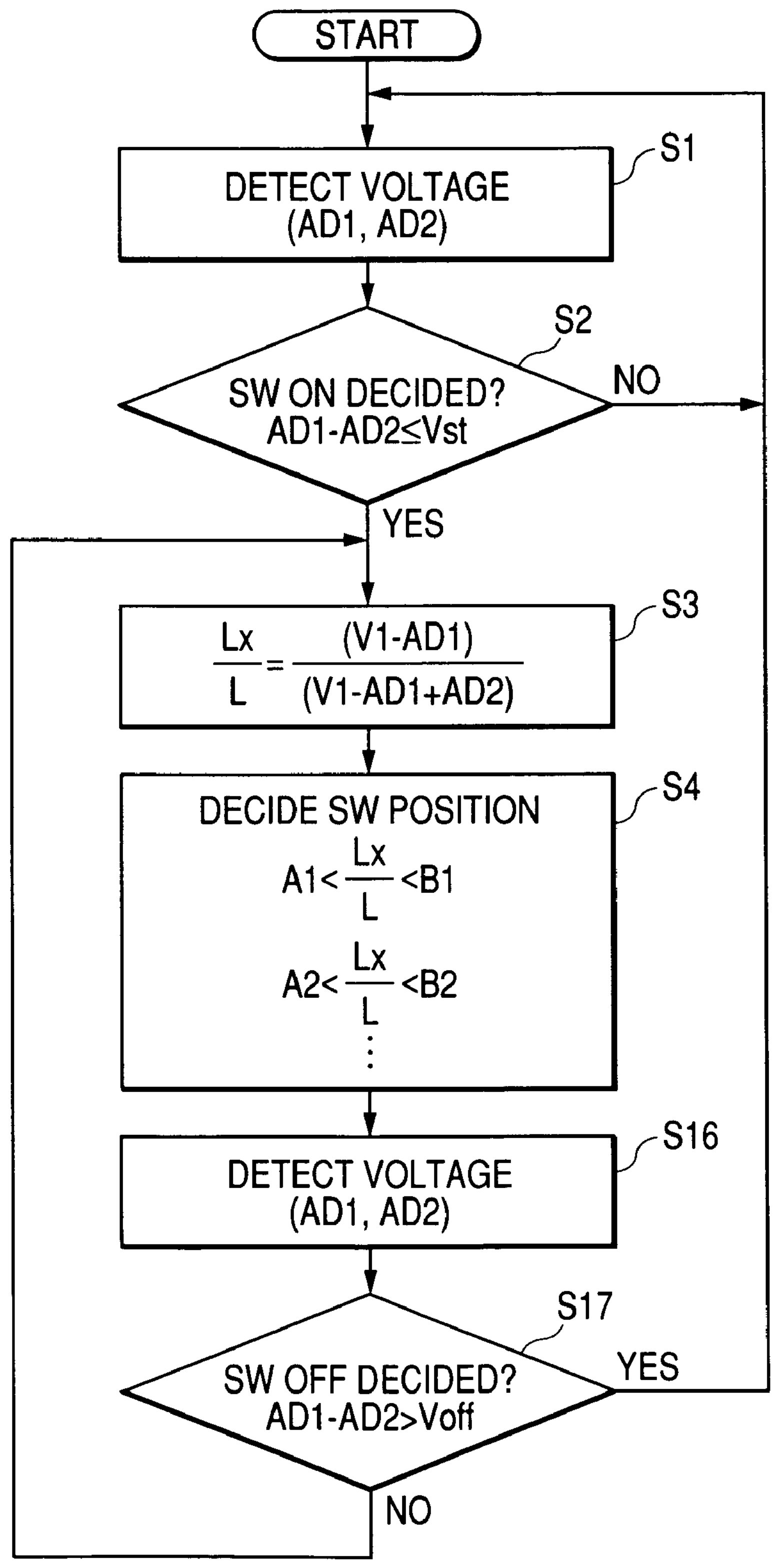
FIG. 24 is a flow chart of an input accepting procedure of an input device according to a seventh embodiment of the invention.

FIG. 24 is a flow chart of the input accepting procedure of an input device according to a seventh embodiment of the invention. It is only the processing contents of the processing unit 7 that the input device according to the seventh embodiment is substantially different from that according to the sixth embodiment. The description of the input device of the seventh embodiment will be omitted by designating the corresponding portions by the common reference characters.

The processing contents of the processing unit 7 according to the seventh embodiment are different from those of the processing unit 7 according to the sixth embodiment in that the destination of the operation of the case, in which it is decided by the deciding operation of step S17 that the operation to the switch element 5 has not been ended, is changed from step S16 to step S3. In the seventh embodiment, therefore, after the start of the operation was detected in step S2, the decisions of steps S3 and S4 are repeated till the end of the operation is detected in step S17. Therefore, the configuration can be exemplified such that the switch position is periodically detected a plurality of times for a time period from the detection instant of the operation start to the detection instant of the operation end by adjusting the repetition rates of steps S3 and S4 for that time period, or such that the switch position is detected substantially continuously.

In the seventh embodiment, the detections of the switch position may be repeatedly executed for the time period from the detection instant of the operation start to the detection instant of the operation end, and the detection of the switch position may be done with the value of (AD1–AD2) being positioned near the second reference level (Voff). It is, therefore, desired that the second reference level (Voff) is set at a smaller value than that of the case of the sixth embodiment. This is because the accurate detection of the switch position is difficult even of it is done with an excessively large contact resistance Rc between the resistors 1 and 3.

As has been described hereinbefore, the seventh embodiment can achieve advantages similar to those of the sixth embodiment excepting that the destination of the operations based on the result of the judging operation of step S17 is partially changed, and the relating points. By adjusting the repeating rates of steps S3 and S4 for the time period from the detection instant of the operation start to the detection instant of the operation end, the configuration can be exemplified such that the switch position is detected periodically a plurality of times for the time period or such that the switch position is detected substantially continuously.

<Eighth Embodiment>

Figure 25:
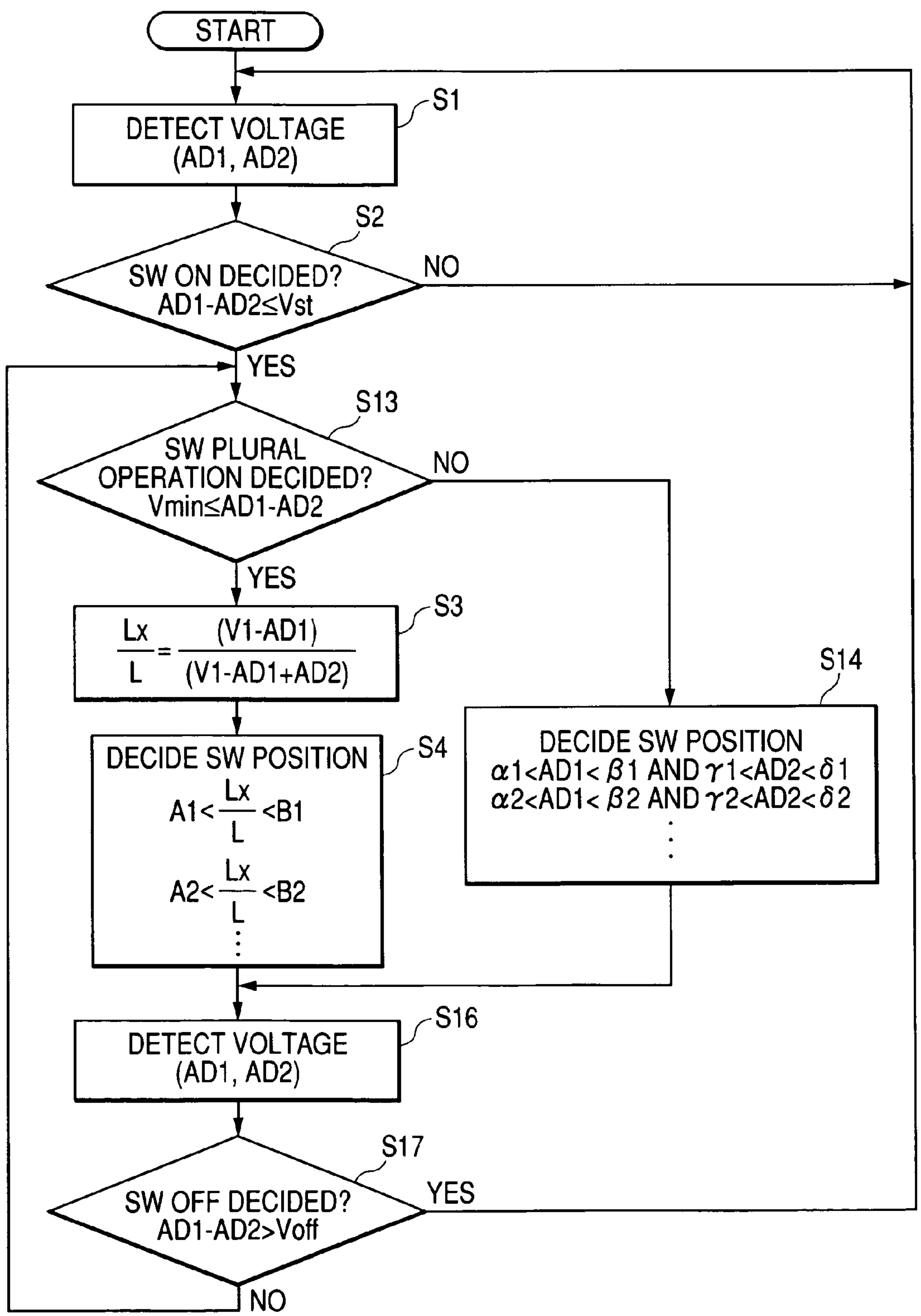
FIG. 25 is a flow chart of an input accepting procedure of an input device according to an eighth embodiment of the invention.

FIG. 25 is a flow chart of the input accepting procedure of an input device according to an eighth embodiment of the invention. It is only a portion of the processing contents of the processing unit 7 that the input device according to the eighth embodiment is substantially different from that according to the seventh embodiment. The description of the input device of the eighth embodiment will be omitted by designating the corresponding portions by the common reference characters. The processing contents of the processing unit 7 according to the eighth embodiment are configured, as shown in FIG. 25, by combining the aforementioned processing contents of the processing unit 7 according to the fourth embodiment with the processing contents of the processing unit 7 according to the seventh embodiment.

In the eighth embodiment, more specifically, in order to specify the switch element 5 being operated in the plural conductive state, the aforementioned step S13 of FIG. 13 is interposed between the aforementioned steps S2 and S3 of FIG. 24, and the aforementioned step S13 of FIG. 13 is accordingly added, as shown in FIG. 25. Therefore, it is possible to decide whether or not the switch operation has been done, to specify the switch element 5 being operated in the single operating state, and to specify the individual switch elements 5 being operated in the plural operating state.

In the eighth embodiment, in addition to the aforementioned first and second reference levels (Vst and Voff), there is introduced a third reference level (Vmin), which is used to decide whether the operating state is single or plural. This third reference level (Vmin) is equal to the reference value Vmin in the aforementioned third embodiment, and the decision principle of the single operating state and the plural operating state is similar to that of the third embodiment. Moreover, the third reference level (Vmin) is set to a value smaller than those of the first and second reference levels (Vst and Voff).

Hereinafter, specific processing contents will be described. The processing contents themselves of the individual steps in FIG. 25 are similar to those of the aforementioned corresponding steps so that their detail description will be omitted.

In case the switch operation start is detected in step S2, the routine advances to step S13, at which it is judged whether or not the value of (AD1–AD2) is no less than the reference value Vmin (i.e., the third reference level), thereby to judge whether the operating state of the switch element 5 is single or plural. The routine advances to step S3, in case the single operating state is judged, but to step S14 in case the plural operating state is judged. At the individual steps S4 and S14, the switch element 5 being operated is specified, and the routine advances to step S16.

In step S16, the voltage values AD1 and AD2 are detected, and it is decided at the subsequent step S17 whether or not the operation to the switch element 5 has been ended. And, the routine returns to step S1, in case it is judged that the operation to the switch element 5 has been ended, but to step S13 in case it is judged that the operation to the switch element 5 has not been ended. The operations to detect the switch position in steps S3, S4, S13 and S14 are repeated till the end of the operation is detected in step S17.

As a modification of the eighth embodiment, the destination of the routine of the case, in which it is judged in step S17 that the operation to the switch element 5 has not been ended, may be set to step S16 as in the sixth embodiment.

As has been described, the eighth embodiment can achieve advantages similar to those of the seventh embodiment. Even in a case where the switch elements 5 are simultaneously operated, too, which switch element 5 has been operated can be decided on the basis of the voltage values AD1 and AD2 detected, so that various operation inputs can be accepted.

After whether the operating state of the switch element 5 is single or plural was decided in step S13 on the basis of the value of (AD1–AD2), the switch element 5 operated is decided separately for the cases of the single operating state and the plural operating state. It is, therefore, possible to decide the operated switch element 5 accurately.

<Modifications>

Figure 26:
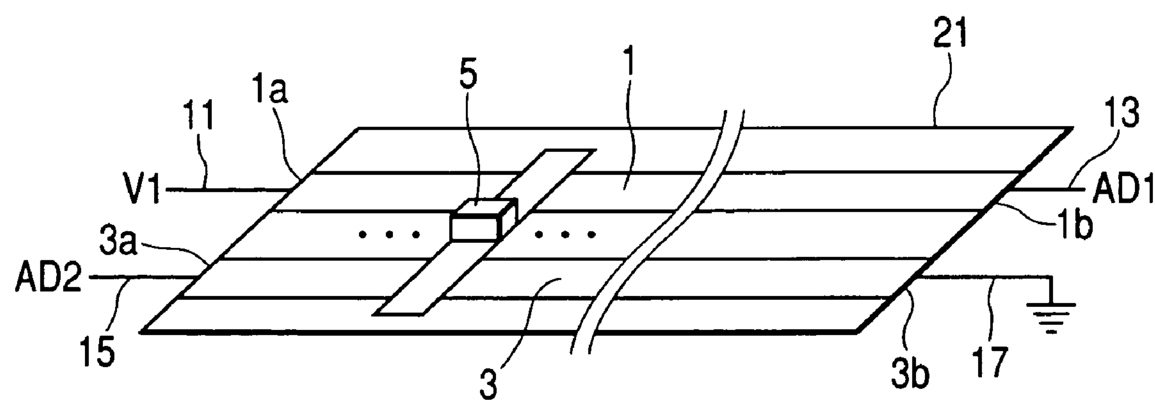
FIG. 26 is a diagram showing the configuration of an essential portion of an input device according to a modification.

FIG. 26 is a diagram showing a configuration of the essential portion of a first modification of the input devices according to the aforementioned first to eighth embodiments. In the first modification, the linear resistors 1 and 3 according to the foregoing individual embodiments are replaced by the resistors 1 and 3, which extend long in a band shape in one direction, as shown in FIG. 26. The resistors 1 and 3 are given a predetermined width in the transverse direction perpendicular to the longitudinal direction and are arranged generally in parallel at a predetermined spacing over an insulating substrate 21. According to the pushing operation of the switch element 5, moreover, the two resistors 1 and 3 are made conductive indirectly through that switch element 5.

Figure 27:
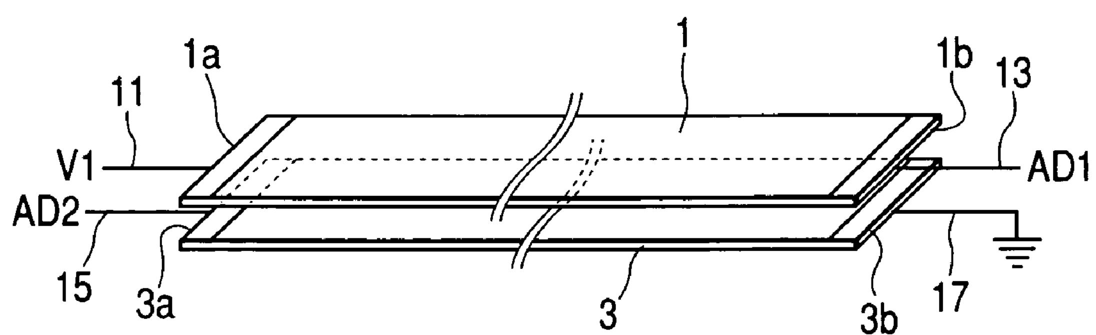
FIG. 27 is a diagram showing the configuration of an essential portion of an input device according to another modification.

FIG. 27 is a diagram showing a configuration of the essential portion of a second modification of the input devices according to the aforementioned first to eighth embodiments. In the second modification, the linear resistors 1 and 3 according to the foregoing individual embodiments are replaced by the band-shaped resistors 1 and 3 of a predetermined width, which are so arranged generally in parallel as to oppose each other, as shown in FIG. 27, but the switch elements 5 are omitted. The pushing operation is done directly on one resistor 1 or 3 (e.g., the resistor 1), and a portion of the resistor 1 or 3 operated is elastically deformed at its local portion so far as to come directly into electric contact with the mating resistor 1 or 3 (e.g., the resistor 3), so that the resistors 1 and 3 are made directly conductive through that contacting portions. The electric contact between the two resistors 1 and 3 is released as the pushing operation is released.

According to the present invention, the first resistor has one terminal of the longitudinal direction applied with a first constant voltage and its other terminal set as a first voltage detecting position; the second resistor has one terminal set as a second voltage detecting position positioned on the other side of the first voltage detecting position and its other terminal connected with the ground or applied with a second constant voltage lower than the first constant voltage; and the conductive condition between the resistors is detected on the basis of the voltage values at the first voltage detecting position and at the second voltage detecting position. When the direct or indirect conduction is caused by the operation between the resistors, therefore, the conductive condition (e.g., the partial voltages or the like on the conductive positions of the voltage applied to the two resistors) between the resistors can be accurately detected on the basis of the voltage values at the first voltage detecting position and at the second voltage detecting position by the simple circuit configuration without being influenced by the contact resistance or the like between the resistors. Therefore, the detection or the like of the conductive position in the longitudinal direction or one direction of the resistors can be accurately done to accept the input contents accurately.

Moreover, when the direct or indirect conduction is caused between the resistors by the operation, the contact resistance or the like between the resistors can be accurately detected on the basis of the voltage values at the first voltage detecting position and at the second voltage detecting position. In a case where the contact resistance between the resistors is higher than a constant reference due to a failure of the operating state (e.g., an insufficient pushing force), therefore, countermeasures such as an unacceptance of the input can be easily taken to improve the reliability.

On the basis of the voltage values at the first voltage detecting position and at the second voltage detecting position, moreover, it is possible to detect how many portions of the resistors in the longitudinal direction are made conductive by the operation and the position of each conductive portion, so that the various operation inputs can be coped with.

According to the present invention, the detection of the conductive position of the resistors in the longitudinal direction can be accurately done without being influenced by the contact resistance or the like between the resistors.

According to the present invention, the predetermined position calculating values for specifying the conductive positions of the resistors can be easily calculated from the relations among the variables L, Lx, V1, V2, AD1 and AD2.

According to the present invention, in a case where the contact resistance of the direct or indirect conductive point, as caused by the operation, between the resistors is high due to an insufficient operation, the potential difference between the first voltage detecting position and the second voltage detecting position becomes accordingly large. By deciding whether or not the potential difference is no more than the predetermined value, therefore, whether or not the conduction between the resistors by the operation has occurred can be easily decided in a high reliability.

According to the present invention, only in a case where it is decided on the basis of the potential difference between the first voltage detecting position and the second voltage detecting position that the conduction has occurred between the resistors, the predetermined position calculating values for specifying the conductive position are calculated from the relations among the variables L, Lx, V1, V2, AD1 and AD2 thereby to detect the conductive position. Therefore, it is possible to prevent the detection of the conductive position (or the switch position) from being done in the insufficient state of the conduction between the resistors due to the insufficient operation, thereby to improve the reliability in the detection of the conductive position.

According to the present invention, the conduction itself between the resistors by the operation and the conductive position (or the switch position) can be easily detected merely by the simple operations to decide what of the preset voltage sections the voltage value of the first voltage detecting position and the voltage value of the second voltage detecting position belong to.

According to the present invention, the value of (AD1−AD2) is smaller in case the resistors become conductive at a plurality of portions than in case the resistors become conductive at one portion in the longitudinal direction. By adjusting the first reference value Vst or the decision reference for deciding whether or not the resistors are conductive and the second reference value Vmin or the decision reference for deciding whether the conduction is at one portion or at a plurality of portions, therefore, it is easy to decide whether or not the conduction between the resistors has occurred and whether the conduction portion is single or plural.

Moreover, it is possible to decide whether the conductive portion is single or plural. It is, therefore, possible to prevent the erroneous detection, in which the detection of the conductive position is mistaken to decide that the conduction is single although plural.

According to the present invention, it is decided on the basis of the value of (AD1−AD2) that the conductive condition between said resistors is in said plural conductive state, and the individual conductive positions are then detected. It is, therefore, possible to detect the individual conductive positions accurately.

According to the present invention, the value of (AD1−AD2) is smaller in case the resistors become conductive at a plurality of portions than in case the resistors become conductive at one portion in the longitudinal direction. By adjusting the reference values Vst and Vmin, therefore, it is easy to decide whether or not the conduction between the resistors has occurred and whether the conduction portion is single or plural. As a result, it is possible to prevent the erroneous detection, in which the detection of the conductive position is mistaken to decide that the conduction is single although plural.

According to the present invention, it is decided on the basis of the value of (AD1−AD2) that the conductions have occurred at a plurality of portions between said resistors, and the individual conductive positions are then detected by applying the individual voltage values at the first voltage detecting position and the second voltage detecting position to the preset voltage sections. It is, therefore, possible to prevent the erroneous detection of the conductive positions, in which the position detections are done in the insufficient conductive state between the resistors due to the insufficient operation or the like or in which the conduction occurs in a plurality of portions although only at one portion in fact, thereby to improve the reliability of the detection of the conductive position (or the switch position).

According to the present invention, merely by the simple operations to decide what of the preset voltage sections the voltage value at the first voltage detecting position and the voltage value at the second voltage detecting position belong to, it is possible to easily detect which combination mode the conduction has occurred at the individual switch positions set in the two resistors in.

According to the present invention, when it is decided that the operation has been done so that the potential difference between the first voltage detecting position and the voltage detecting position becomes lower than the first reference level to cause the direct or indirect conduction between the resistors, it is decided that the direct or indirect conduction between the resistors continues till said potential difference exceeds the second reference level higher than the first reference level. Even in case said potential difference is caused to vary near the first reference level by the reluctant fluctuations of the operating force when the occurrence of the direct or indirect conduction between the resistors is detected, it is possible to prevent the erroneous input from being accepted with a misjudgment that a plurality of operations have been done although they are intrinsically single.

According to the present invention, for the time period from the instant of detecting the occurrence of the direct or indirect conduction between the resistors to the end of the conduction, the conductive position of the resistors in the longitudinal direction can be accurately done without being influenced by the contact resistance or the like between the resistors.

According to the present invention, for the time period from the instant of detecting the occurrence of the direct or indirect conduction between the resistors to the end of the conduction, the detection of the conductive position on the longitudinal direction of the resistors can be done once, periodically by a plurality of times, or substantially continuously according to the contents of the operation to be accepted.

According to the present invention, the predetermined position calculating values for specifying the conductive positions of the resistors can be easily calculated from the relations among the variables L, Lx, V1, V2, AD1 and AD2.

According to the present invention, the difference of the voltage values between the first and second voltage detecting positions is smaller in case the conduction occurs at a plurality of portions between the resistors than in case the conduction occurs at one portion in the longitudinal direction between the resistors. By adjusting the values of the first to third reference levels, therefore, whether the conductive portion is single or plural can be easily decided for the time period from the instant of detecting the occurrence of the direct or indirect conduction between the resistors to the end of the conduction.

Moreover, it can be decided whether the conductive portion is single or plural. It is, therefore, possible to prevent the erroneous input from being accepted with a misjudgment that a plurality of operations have been done although they are intrinsically single.

According to the present invention, for the time period from the instant of detecting the occurrence of the direct or indirect conduction between the resistors to the end of the conduction, it is decided on the basis of the difference of the voltage values between the first and second voltage detecting positions that the conductive condition between the resistors is in said plural conductive state, and the individual conductive positions are then detected so that the detections of the individual conductive positions can be accurately done.

According to the present invention, for the time period from the instant of detecting the occurrence of the direct or indirect conduction between the resistors to the end of the conduction, it is decided on the basis of the difference of the voltage values between the first and second voltage detecting positions that the conductive condition between the resistors is in said plural conductive state, and the individual conductive positions are then detected by applying the individual voltage values at the first voltage detecting position and at the second voltage detecting position to the preset voltage sections. It is, therefore, possible to prevent the erroneous detection of the conductive positions, in which the position detections are done in the insufficient conductive state between the resistors due to the insufficient operation or the like or in which the conduction occurs in a plurality of portions although only at one portion in fact, thereby to improve the reliability of the detection of the conductive position (or the switch position).

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An input device comprising:

a first resistor and a second resistor each having an equal size and shape extending in one direction and arranged in parallel to each other and each having a constant and equal resistance per unit length in longitudinal direction thereof; and a processing unit configured to detect a conductive condition established between the first resistor and the second resistor, wherein one terminal of the first resistor in the longitudinal direction thereof is configured to be applied with a first constant voltage and the other terminal of the first resistor is configured as a first voltage detecting position, wherein one terminal of the second resistor in the longitudinal direction thereof is configured as a second voltage detecting position and the other terminal of the second resistor is configured to be either connected to ground or applied with a second constant voltage lower than the first constant voltage, and wherein the processing unit detects the conductive condition between the first and the second resistors in accordance with voltage values at the first and the second voltage detecting positions.

2. The input device as claimed in claim 1, wherein the processing unit detects a conductive position between the first and the second resistors in accordance with the voltage values at the first and the second voltage detecting positions.

3. The input device as claimed in claim 2, wherein in case: a length of the first and the second resistors in the longitudinal direction is designated by L; a distance from the one terminal of the first and the second resistors to the first and the second conductive position is designated by Lx; the voltage value at the one terminal of the first resistor is designated by V1; the voltage value at the other terminal of the second resistor is designated by V2; the voltage value at the first voltage detecting position is designated by AD1; and the voltage value at the second voltage detecting position is designated by AD2, the processing unit calculates a position calculating value in which varies with the distance Lx for specifying the conductive position, from the relations among the variables L, Lx, V1, V2, AD1 and AD2.

4. The input device as claimed in claim 1, wherein the processing unit decides whether or not a potential difference between the first and the second voltage detecting position is no more than a predetermined value, to thereby detect the conductive condition.

5. The input device as claimed in claim 3, wherein the processing unit decides whether or not a potential difference between the first and the second voltage detecting position is no more than a predetermined value, to thereby detect the conductive condition, wherein when the conductive condition is detected, the processing unit calculates the position calculating value from the relations among the variables L, Lx, V1, V2, AD1 and AD2, and wherein the processing unit decides which of a plurality of calculation value sections preset according to a plurality of switch positions configured on the first and the second resistors in the longitudinal direction the calculated position calculating value belongs to, to thereby decide which of the plural switch positions the conductive position corresponds to.

6. The input device as claimed in claim 1, wherein the processing unit decides which of a plurality of voltage sections preset for the first and the second voltage detecting positions individually in accordance with a plurality of switch positions configured on the first and the second resistors in the longitudinal direction the voltage values of the first and the second voltage detecting position belong to, to thereby decide which of the switch positions the conductive position corresponds to.

7. The input device as claimed in claim 1, wherein the processing unit decides that the conduction between the first and the second resistors has not occurred, in case a value of (AD1−AD2), which is calculated by subtracting the voltage value AD2 at the second voltage detecting position from the voltage value AD1 at the first voltage detecting position, exceeds a first preset reference value Vst, wherein the processing unit decides that the conductive condition between the first and the second resistors is in a single conductive state, in which the conduction between the first and the second resistors occurs at one position in the longitudinal direction, in case the value of (AD1−AD2) is no more than the first reference value Vst and no less than a preset second reference value Vmin (wherein Vmin<Vst), and wherein the processing unit decides that the conductive condition between the first and the second resistors is in a plural conductive state, in which the conduction between the first and the second resistors occurs at a plurality of positions in the longitudinal direction, in case the value of (AD1−AD2) is less than the second reference value Vmin.

8. The input device as claimed in claim 7, wherein when the processing unit detects the plural conductive state, the processing unit detects each of the plurality of conductive positions in accordance with the voltage values of the first and the second voltage detecting position.

9. The input device as claimed in claim 1, wherein the processing unit decides that the conduction has occurred between the first and the second resistors, in case a value of (AD1−AD2), which is calculated by subtracting a voltage value AD2 at the second voltage detecting position from a voltage value AD1 at the first voltage detecting position, is in range of between preset reference values Vmin and Vst (wherein Vmin<Vst), and wherein the processing unit decides that the conduction between the first and the second resistors has not occurred, in case the value of (AD1−AD2) is not in range of between the reference values Vmin and Vst.

10. The input device as claimed in claim 7, wherein when the processing unit detects the plural conductive state, the processing unit detects which of a plurality of voltage sections preset individually for the first and the second voltage detecting positions accordingly as the conduction occurs in any combination mode at each of a plurality of switch positions set for the first and the second resistors in the longitudinal direction the voltage values at the first and the second voltage detecting positions belong to, to thereby decide which of the switch positions of the first and the second resistors the conduction has occurred at.

11. The input device as claimed in claim 1, wherein the processing unit decides which of a plurality of voltage sections preset individually for the first and the second voltage detecting positions accordingly as the conduction occurs in any combination mode at each of a plurality of switch positions set for the first and the second resistors in the longitudinal direction the voltage value at the first and the second voltage detecting positions belong to, to thereby decide which of the switch positions of the first and the second resistors the conduction has occurred at.

12. The input device as claimed in claim 1, wherein the processing unit decides that the conduction between the first and the second resistors has occurred, when a potential difference between the first and the second voltage detecting positions is below a preset first reference level; and wherein the processing unit decides that the conduction between the first and the second resistors has ended, when the potential difference exceeds a second reference level preset higher than the first reference level.

13. The input device as claimed in claim 12, wherein the processing unit detects the conductive position between the first and the second resistors in the longitudinal direction, in accordance with the voltage values at the first and the second voltage detecting positions, for a time period from the detection of the occurrence of the conduction between the first and the second resistors to the detection of the end of the conduction.

14. The input device as claimed in claim 13, wherein the processing unit performs the detection of the conductive position based on the voltage values at the first and the second voltage detecting positions, once, periodically by a plurality of times, or substantially continuously for the time period from the detection of the occurrence of the conduction between the first and the second resistors to the detection of the end of the conduction.

15. The input device as claimed in claim 13, wherein in case: a length of the first and the second resistors in the longitudinal direction is designated by L; a distance from the one terminal of the first and the second resistors to the first and the second conductive position is designated by Lx; the voltage value at the one terminal of the first resistor is designated by V1; the voltage value at the other terminal of the second resistor is designated by V2; the voltage value at the first voltage detecting position is designated by AD1; and the voltage value at the second voltage detecting position is designated by AD2, the processing unit calculates a position calculating value in which varies with the distance Lx for specifying the conductive position, from the relations among the variables L, Lx, V1, V2, AD1 and AD2.

16. The input device as claimed in claim 12, wherein for a time period from the detection of the occurrence of the conduction between the first and the second resistors to the detection of the end of the conduction, the processing unit decides that the conductive condition between the first and the second resistors is in a single conductive state, in which the conduction between the first and the second resistors occurs at one position in the longitudinal direction, in case the value calculated by subtracting the voltage valve at the second voltage detecting position from the voltage value at said first voltage detecting position is no more than the first reference value and no less than a preset third reference value lower than the first reference level, and the processing unit decides that the conductive condition between the first and the second resistors is in a plural conductive state, in which the conduction between the first and the second resistors occurs at a plurality of positions in the longitudinal direction, in case the value is less than the third reference value.

17. The input device as claimed in claim 16, wherein the processing unit detects a plurality of conductive positions between the first and the second resistors in the longitudinal direction, in accordance with the first and the second voltage detecting positions, in case the plural conductive state is decided.

18. The input device as claimed in claim 16, wherein the processing unit decides, in case the plural conductive state is decided, which of a plurality of voltage sections preset individually for the first and the second voltage detecting positions accordingly as the conduction occurs in any combination mode at each of a plurality of switch positions set for the first and the second resistors in the longitudinal direction the voltage value at the first and the second voltage detecting positions belong to, to thereby decide which of the switch positions of the first and the second resistors the conduction has occurred at.

19. An input method for an input device having: a first resistor and a second resistor each having an equal size and shape extending in one direction and arranged in parallel to each other and each having a constant and equal resistance per unit length in longitudinal direction thereof; and a processing unit configured to detect a conductive condition established between the first resistor and the second resistor, the method comprising:

applying a first constant voltage to one terminal of the first resistor in the longitudinal direction thereof;

configuring the other terminal of the first resistor as a first voltage detecting position;

configuring one terminal of the second resistor in the longitudinal direction thereof as a second voltage detecting position;

either connecting the other terminal of the second resistor to ground or applying a second constant voltage lower than the first constant voltage to the other terminal of the second resistor; and detecting the conductive condition between the first and the second resistors in accordance with voltage values at the first and the second voltage detecting positions.

20. The input method as claimed in claim 19, wherein in the detecting of the conductive condition, a conductive condition between the first and the second resistors is detected in accordance with the voltage values at the first and the second voltage detecting positions.

21. The input method as claimed in claim 20, wherein in case: a length of the first and the second resistors in the longitudinal direction is designated by L; a distance from the one terminal of the first and the second resistors to the first and the second conductive position is designated by Lx; the voltage value at the one terminal of the first resistor is designated by V1; the voltage value at the other terminal of the second resistor is designated by V2; the voltage value at the first voltage detecting position is designated by AD1; and the voltage value at the second voltage detecting position is designated by AD2, in the detecting of the conductive condition, a position calculating value in which varies with the distance Lx for specifying the conductive position is calculated, from the relations among the variables L, Lx, V1, V2, AD1 and AD2.

22. The input method as claimed in claim 21, wherein in the detecting of the conductive condition, whether or not a potential difference between the first and the second voltage detecting position is no more than a predetermined value is decided, to thereby detect the conductive condition, wherein in the detecting of the conductive condition, when the conductive condition is detected, the position calculating value is calculated from the relations among the variables L, Lx, V1, V2, AD1 and AD2, and wherein in the detecting of the conductive condition, which of a plurality of calculation value sections preset according to a plurality of switch positions configured on the first and the second resistors in the longitudinal direction the calculated position calculating value belongs to is decided, to thereby decide which of the plural switch positions the conductive position corresponds to.

23. The input method as claimed in claim 19, wherein in the detecting of the conductive condition, whether or not a potential difference between the first and the second voltage detecting position is no more than a predetermined value is decided, to thereby detect the conductive condition.

24. The input method as claimed in claim 19, wherein in the detecting of the conductive condition, which of a plurality of voltage sections preset for the first and the second voltage detecting positions individually in accordance with a plurality of switch positions configured on the first and the second resistors in the longitudinal direction the voltage values of the first and the second voltage detecting position belong to is decided, to thereby decide which of the switch positions the conductive position corresponds to.

25. The input method as claimed in claim 19, wherein in the detecting of the conductive condition, the conduction between the first and the second resistors is decided to not being occurred, in case a value of (AD1−AD2), which is calculated by subtracting the voltage value AD2 at the second voltage detecting position from the voltage value AD1 at the first voltage detecting position, exceeds a first preset reference value Vst, wherein in the detecting of the conductive condition, the conductive condition between the first and the second resistors is in a single conductive state, in which the conduction between the first and the second resistors occurs at one position in the longitudinal direction, is decided, in case the value of (AD1−AD2) is no more than the first reference value Vst and no less than a preset second reference value Vmin (wherein Vmin<Vst), and wherein in the detecting of the conductive condition, the conductive condition between the first and the second resistors is in a plural conductive state, in which the conduction between the first and the second resistors occurs at a plurality of positions in the longitudinal direction, is decided, in case the value of (AD1−AD2) is less than the second reference value Vmin.

26. The input method as claimed in claim 25, wherein when the plural conductive state in detecting of the conductive condition, each of the plurality of conductive positions in accordance with the voltage values of the first and the second voltage detecting position is detected.

27. The input method as claimed in claim 25, wherein when the plural conductive state is detected in the detecting of the conductive condition, which of a plurality of voltage sections preset individually for the first and the second voltage detecting positions accordingly as the conduction occurs in any combination mode at each of a plurality of switch positions set for the first and the second resistors in the longitudinal direction the voltage values at the first and the second voltage detecting positions belong to, is decided, to thereby decide which of the switch positions of the first and the second resistors the conduction has occurred at.

28. The input method as claimed in claim 19, wherein in the detecting of the conductive condition, the conduction is decided to be occurred between the first and the second resistors, in case a value of (AD1−AD2), which is calculated by subtracting a voltage value AD2 at the second voltage detecting position from a voltage value AD1 at the first voltage detecting position, is in range of between preset reference values Vmin and Vst (wherein Vmin<Vst) and wherein the conduction between the first and the second resistors is decided to not being occurred, in case the value of (AD1−AD2) is not in range of between the reference values Vmin and Vst.

29. The input method as claimed in claim 19, wherein in the detecting of the conductive condition, which of a plurality of voltage sections preset individually for the first and the second voltage detecting positions accordingly as the conduction occurs in any combination mode at each of a plurality of switch positions set for the first and the second resistors in the longitudinal direction the voltage value at the first and the second voltage detecting positions belong to, is decided, to thereby decide which of the switch positions of the first and the second resistors the conduction has occurred at.

30. The input method as claimed in claim 19, wherein in the detection of the conductive condition, the conduction between the first and the second resistors is decided to be occurred, when a potential difference between the first and the second voltage detecting positions is below a preset first reference level; and wherein in the detection of the conductive condition, the conduction between the first and the second resistors is decided to be ended, when the potential difference exceeds a second reference level preset higher than the first reference level.

31. The input method as claimed in claim 30, in the detection of the conductive condition, the conductive position between the first and the second resistors in the longitudinal direction is detected, in accordance with the voltage values at the first and the second voltage detecting positions, for a time period from the detection of the occurrence of the conduction between the first and the second resistors to the detection of the end of the conduction.

32. The input method as claimed in claim 31, wherein the detection of the conductive position based on the voltage values at the first and the second voltage detecting positions is performed, once, periodically by a plurality of times, or substantially continuously for the time period from the detection of the occurrence of the conduction between the first and the second resistors to the detection of the end of the conduction.

33. The input method as claimed in claim 31, wherein in case: a length of the first and the second resistors in the longitudinal direction is designated by L; a distance from the one terminal of the first and the second resistors to the first and the second conductive position is designated by Lx; the voltage value at the one terminal of the first resistor is designated by V1; the voltage value at the other terminal of the second resistor is designated by V2; the voltage value at the first voltage detecting position is designated by AD1; and the voltage value at the second voltage detecting position is designated by AD2, in the detecting of the conductive condition, a position calculating value in which varies with the distance Lx for specifying the conductive position is calculated, from the relations among the variables L, Lx, V1, V2, AD1 and AD2.

34. The input method as claimed in claim 30, wherein in the detection of the conductive condition, for a time period from the detection of the occurrence of the conduction between the first and the second resistors to the detection of the end of the conduction, the conductive condition between the first and the second resistors is decided to be in a single conductive state, in which the conduction between the first and the second resistors occurs at one position in the longitudinal direction, in case the value calculated by subtracting the voltage valve at the second voltage detecting position from the voltage value at said first voltage detecting position is no more than the first reference value and no less than a preset third reference value lower than the first reference level, and the conductive condition between the first and the second resistors is decided to be in a plural conductive state, in which the conduction between the first and the second resistors occurs at a plurality of positions in the longitudinal direction, in case the value is less than the third reference value.

35. The input method as claimed in claim 34, wherein in the detection of the conductive condition, a plurality of conductive positions between the first and the second resistors in the longitudinal direction is detected, in accordance with the first and the second voltage detecting positions, in case the plural conductive state is decided.

36. The input method as claimed in claim 34, wherein in the detection of the conductive condition, in case the plural conductive state is decided, which of a plurality of voltage sections preset individually for the first and the second voltage detecting positions accordingly as the conduction occurs in any combination mode at each of a plurality of switch positions set for the first and the second resistors in the longitudinal direction the voltage value at the first and the second voltage detecting positions belong to is decided, to thereby decide which of the switch positions of the first and the second resistors the conduction has occurred at.

* * * * *